United States Patent [19]

Selvidge et al.

[11] Patent Number: 5,649,176

[45] Date of Patent: Jul. 15, 1997

[54] TRANSITION ANALYSIS AND CIRCUIT RESYNTHESIS METHOD AND DEVICE FOR DIGITAL CIRCUIT MODELING

[75] Inventors: Charles W. Selvidge, Charlestown; Matthew L. Dahl, Cambridge, both of Mass.

[73] Assignee: Virtual Machine Works, Inc., Cambridge, Mass.

[21] Appl. No.: 513,605

[22] Filed: Aug. 10, 1995

[51] Int. Cl.$^6$ .................................................. G06F 1/12
[52] U.S. Cl. ........................................ 395/551; 364/489
[58] Field of Search ............................ 395/551, 500; 364/488, 489, 490, 491

[56] References Cited

U.S. PATENT DOCUMENTS

| 4,450,560 | 5/1984 | Conner ................................. 371/25 |
| 4,697,241 | 9/1987 | Lavi .................................... 364/488 |
| 5,180,937 | 1/1993 | Laird et al. ........................... 327/276 |
| 5,420,544 | 5/1995 | Ishibashi .............................. 331/11 |
| 5,428,626 | 6/1995 | Frisch et al. ........................ 364/488 X |

FOREIGN PATENT DOCUMENTS

| 0 453 171 A2 | 10/1991 | European Pat. Off. .......... G06F 1/04 |
| 2 180 382 | 3/1987 | United Kingdom ............ H03K 19/00 |

OTHER PUBLICATIONS

Laird, D., et al., "Delay Compensator," *LSI Logic Corp.*, pp. 1–8, (Aug. 1990).

*Primary Examiner*—Thomas M. Heckler
*Attorney, Agent, or Firm*—Hamilton, Brook, Smith & Reynolds, P.C.

[57] ABSTRACT

A method of configuring a configurable logic system, including a single or multi-FPGA network, is disclosed in which an internal clock signal is defined that has a higher frequency than timing signals the system receives from the environment in which it is operating. The frequency can be at least ten times higher than a frequency of the environmental timing signals. The logic system is configured to have a controller that coordinates operation of its logic operation in response to the internal clock signal and environmental timing signals. Specifically, the controller is a finite state machine that provides control signals to sequential logic elements such as flip-flops. The logic elements are clocked by the internal clock signal. In the past, emulation or simulation devices, for example, operated in response to timing signals from the environment. A new internal clock signal, invisible to the environment, rather than the timing signals is used to control the internal operations of the devices. Additionally, a specific set of transformations are disclosed that enable the conversion of a digital circuit design with an arbitrary clocking methodology into a single clock synchronous circuit.

50 Claims, 14 Drawing Sheets

TRANSITION ANALYSIS AND CIRCUIT RESYNTHESIS METHOD AND DEVICE FOR DIGITAL CIRCUIT MODELING

BACKGROUND OF THE INVENTION

Configurable logic devices are a general class of electronic devices that can be easily configured to perform a desired logic operation or calculation. One example is Mask Programmed Gate Arrays (MPGA). These devices offer density and performance. Poor turn around time coupled with only one-time configurability tend to diminish their ubiquitous use. Reconfigurable logic devices or programmable logic devices (such as Field Programmable Gate Arrays (FPGA)) offer lower levels of integration but are reconfigurable, i.e., the same device may be programmed many times to perform different logic operations. Most importantly, the devices can be programmed to create gate array prototypes instantaneously, allowing complete dynamic reconfigurability, something that MPGAs can not provide.

System designers commonly use reconfigurable logic devices such as FPGAs to test logic designs prior to manufacture or fabrication in an effort to expose design flaws. Usually, these tests take the form of emulations in which a reconfigurable logic devices models the logic design, such as a microprocessor, in order to confirm the proper operation of the logic design along with possibly its compatibility with an environment or system in which it is intended to operate.

In the case of testing a proposed microprocessor logic design, a netlist describing the internal architecture of the microprocessor is compiled and then loaded into a particular reconfigurable logic device by some type of configuring device such as a host workstation. If the reconfigurable logic device is a single or array of FPGAs, the loading step is as easy as down-loading a file describing the compiled netlist to the FPGAs using the host workstation or other computer. The programmed configurable logic device is then tested in the environment of a motherboard by confirming that its response to inputs agrees with the design criteria.

Alternatively, reconfigurable logic devices also find application as hardware accelerators for simulators. Rather than testing a logic design by programming a reconfigurable device to "behave" as the logic device in the intended environment for the logic design, e.g., the motherboard, a simulation involves modeling the logic design on a workstation. In this environment, the reconfigurable logic device performs gate evaluations for portions of the model in order to relieve the workstation of this task and thereby decreases the time required for the simulation.

Recently, most of the attention in complex logic design modeling has been directed toward FPGAs. The lower integration of the FPGAs has been overcome by forming heterogeneous networks of special purpose FPGA processors connected to exchange signals via some type of interconnect. The network of the FPGAs is heterogeneous not necessarily in the sense that it is composed of an array of different devices but that the devices have been individually configured to cooperatively execute different sections, or partitions, of the overall logic design. These networks rely on static routing at compile-time to organize the propagation of logic signals through the FPGA network. Static refers to the fact that all data or logic signal movement can be determined and optimized during compiling.

When a logic design intended for eventual MPGA fabrication is mapped to an FPGA, hold time errors are a problem that can arise, particularly in these complex configurable logic device networks. A digital logic design that has been loaded into the configurable logic devices receives timing signals, such as clock signals, and data signals from the environment in which it operates. Typically, these timing signals coordinate the operation of storage or sequential logic components such as flip-flops or latches. These storage devices control the propagation of combinational signals, which are originally derived from the environmental data signals, through the logic devices.

Hold time problems commonly arise where a timing signal is intended to clock a particular storage element to signal that a value at the element's input terminal should be held or stored. As long as the timing signal arrives at the storage element while the value is valid, correct operation is preserved. Hold time violations occur when the timing signal is delayed beyond a time for which the value is valid, leading to the loss of the value. This effect results in the destruction of information and generally leads to the improper operation of the logic design.

Identification and mitigation of hold time problems presents many challenges. First, while the presence of a hold time problem can be recognized by the improper operation of the logic design, identifying the specific location within the logic design of the hold time problem is a challenge. This requires sophisticated approximations of the propagation delays of timing signals and combinational signals through the logic design. Once a likely location of a hold time problem has been identified, the typical approach is somewhat ad hoc. Delay is added on the path of the combinational signals to match the timing signal delays. This added delay, however, comes at its own cost. First, the operational speed of the design must now take into account this new delay. Also, new hold time problems can now arise because of the changed clock speed. In short, hold time problems are both difficult to identify and then difficult to rectify.

Other problems arise when a logic design intended for ultimate MPGA fabrication, for example, is realized in FPGAs. Latches, for instance, are often implemented in MPGAs. FPGA, however, do not offer a corresponding element.

SUMMARY OF THE INVENTION

The present invention seeks to overcome the hold time problem by imposing a new timing discipline on a given digital circuit design through a resynthesis process that yields a new but equivalent circuit. The resynthesis process also transforms logic devices and timing structures to those that are better suited to FPGA implementation. This new timing discipline is insensitive to unpredictable delays in the logic devices and eliminates hold time problems. It also allows efficient implementation of latches, multiple clocks, and gated clocks. By means of the resynthesis, the equivalent circuit relies on a new higher frequency internal clock (or virtual clock) that is distributed with minimal skew. The internal clock signal controls the clocking of all or substantially all the storage elements, e.g. flip-flops, in the equivalent circuit, in effect discretizing time and space into manageable pieces. The user's clocks are treated in the same manner as user data signals.

In contrast with conventional approaches, the present invention does not allow continuous inter-FPGA signal flow. Instead, all signal flow is synchronized to the internal clock so that signals flow between flip-flops through intermediate FPGAs in discrete hops. The internal clock provides a time base for the circuit's operation.

In general, according to one aspect, the invention features a method of configuring a configurable or programmable logic system. Generally, such logic systems include single or multi-FPGA network, although the invention can be applied to other types of configurable devices. Particular to the invention, the logic system is provided with an internal clock signal that typically has a higher frequency, by a factor of at least four, than timing signals the system receives from the environment in which it is operating. The logic system is configured to have a controller that coordinates operation of the logic in response to the internal clock signal and the environmental timing signals. In the past, while emulation or simulation devices, for example, operated in response to timing signals from the environment, a new internal clock signal, invisible to the environment, was not used to control the internal operations of the devices.

In specific embodiments, a synchronizer is incorporated to essentially generate a synchronized version of the environmental timing signal. This synchronized version behaves much like other data signals from the environment. This synchronizer feeds the resulting sampled environmental clock signals to a finite state machine, which generates control signals. The logic operations are then coordinated by application of these control signals to sequential logic elements.

In more detail, the logic system is configured to have both combinational logic, e.g. logic gates, and sequential logic, e.g. flip-flops, to perform the logic operations. The control signals function as load enable signals to the sequential logic. The internal clock signal is received at the clock terminals of that logic. Just like the original digital circuit design, each sequential logic element operates in response to the environmental timing signals. Now, however, these timing signal control the load enable of the elements, not the clocking. It is the internal clock signal that now clocks the elements. As a result, the resynthesized circuit operates synchronously with a single clock signal regardless of the clocking scheme of the original digital circuit.

In general, according to another aspect, the invention features a method for converting a digital circuit design into a new circuit that is substantially functionally equivalent to the digital circuit design. First, the internal clock signal is defined, then sequential logic elements of the digital circuit design are resynthesized to operate in response to the internal clock signal in the new circuit rather than simply the environmental timing signals.

In specific embodiments, flip-flops of the digital circuit design, which are clocked by the environmental timing signal, are resynthesized to be clocked by the internal clock signal and load enabled in response to the environmental timing signals. Finite state machines are used to actually generate control signals that load enable each flip-flop. The load enable signals are sometimes also generated from a logic combination of finite state machine signals and logic gates.

In other embodiments, latches in the digital circuit design, which were gated by the environmental timing signals, are resynthesized to be flip-flops or latches in future FPGA designs in the new circuit that are clocked by the new internal or virtual clock signal. These new flip-flops are load enabled in response to the environmental timing signals.

In general, according to still another aspect, the invention features a logic system for generating output signals to an environment in response to at least one environmental timing signal and environmental data signals provided from the environment. This logic system has its own internal clock and at least one configurable logic device. The internal architecture of the configurable device includes logic for generating the output signals in response to the environmental data signals and a controller, specifically a finite state machine, for coordinating operation of the logic in response to the internal clock signal and the environmental timing signal.

Specifically, the logic includes sequential and combinational logic elements. The sequential logic elements are clocked by the internal clock signal and load enabled in response to the environmental timing signals.

The above and other features of the invention including various novel details of construction and combinations of parts, and other advantages, will now be more particularly described with reference to the accompanying drawings and pointed out in the claims. It will be understood that the particular method and device embodying the invention is shown by way of illustration and not as a limitation of the invention. The principles and features of this invention may be employed in various and numerous embodiments without the departing from the scope of the invention.

BRIEF DESCRIPTION OF THE DRAWINGS

In the accompanying drawings, like reference characters refer to the same parts throughout the different views. The drawings are not necessarily to scale and in some cases have been simplified. Emphasis is instead placed upon illustrating the principles of the invention. Of the drawings.

FIG. 10B is a timing diagram showing the signal values over time in the circuit;

DETAILED DESCRIPTION OF THE PREFERRED EMBODIMENTS

Figure 1:
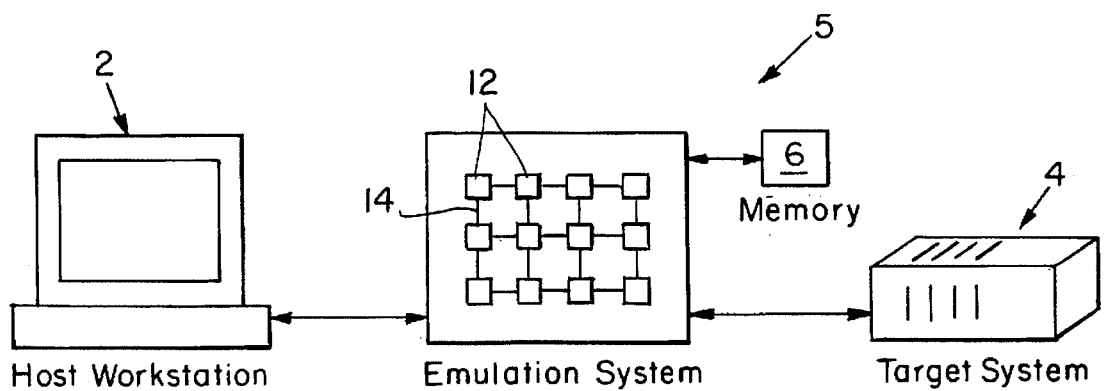
FIG. 1 is a schematic diagram showing a prior art emulation system and its interaction with an environment and a host workstation.

Turning now to the drawings, FIG. 1 is a schematic diagram showing an emulation system 5 of the prior art. The emulation system 5 operates in an environment such as a target system 4 from which it receives environmental timing signals and environmental data signals and responsive to these signals generates output data signals to the environment. A configuring device 2 such as a host workstation is provided to load configuration data into the emulation system 5.

The emulation system 5 is usually constructed from individual configurable logic devices 12, specifically FPGA chips are common. The configurable logic devices 12 are connected to each other via an interconnect 14. Memory elements 6 are also optionally provided and are accessible by the configurable logic devices 12 through the interconnect 14.

The host workstation 2 downloads the configuration data that will dictate the internal configuration of the logic devices 12. The configuration data is compiled from a digital circuit description that includes the desired manner in which the emulation system 5 is intended to interact with the environment or target system 4. Typically, the target system 4 is a larger electronic system for which some component such as a microprocessor is being designed. The description applies to this microprocessor and the emulation system 5 loaded with the configuration data confirms compatibility between the microprocessor design and the target system 4. Alternatively, the target system 4 can be a device for which the logic system satisfies some processing requirements. Further, the emulation system 5 can be used for simulations in a software or FPGA based logic simulation.

Figure 2:
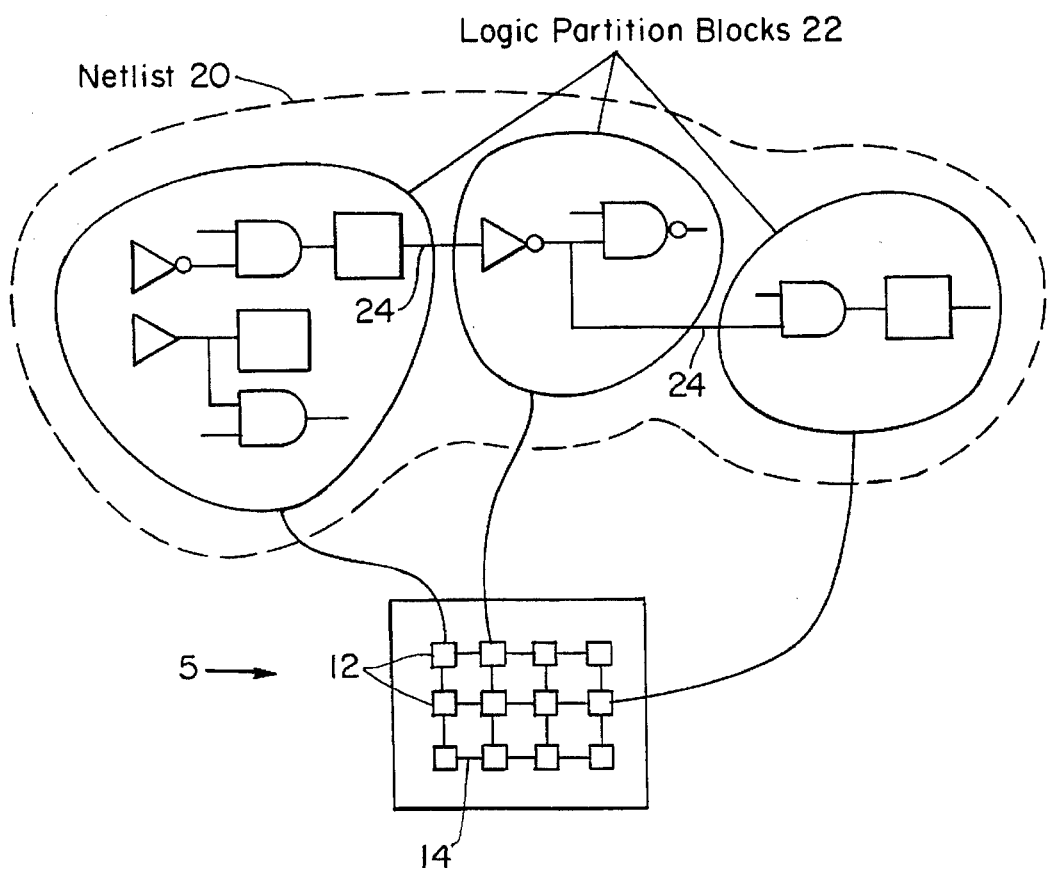
FIG. 2 shows a method for impressing a logic design on the emulation system.

FIG. 2 illustrates how the logic design is distributed among the logic devices 12 of the logic system 5. A netlist 20 describing the logic connectivity of the logic design is separated into logic partition blocks 22. The complexity of the blocks 22 is manipulated so that each can be realized in a single FPGA chip 12. The logic signal connections that must bridge the partition blocks 24, global links, are provided by the interconnect 14. Obviously, the exemplary netlist 20 has been substantially simplified for the purposes of this illustration.

Figure 3:
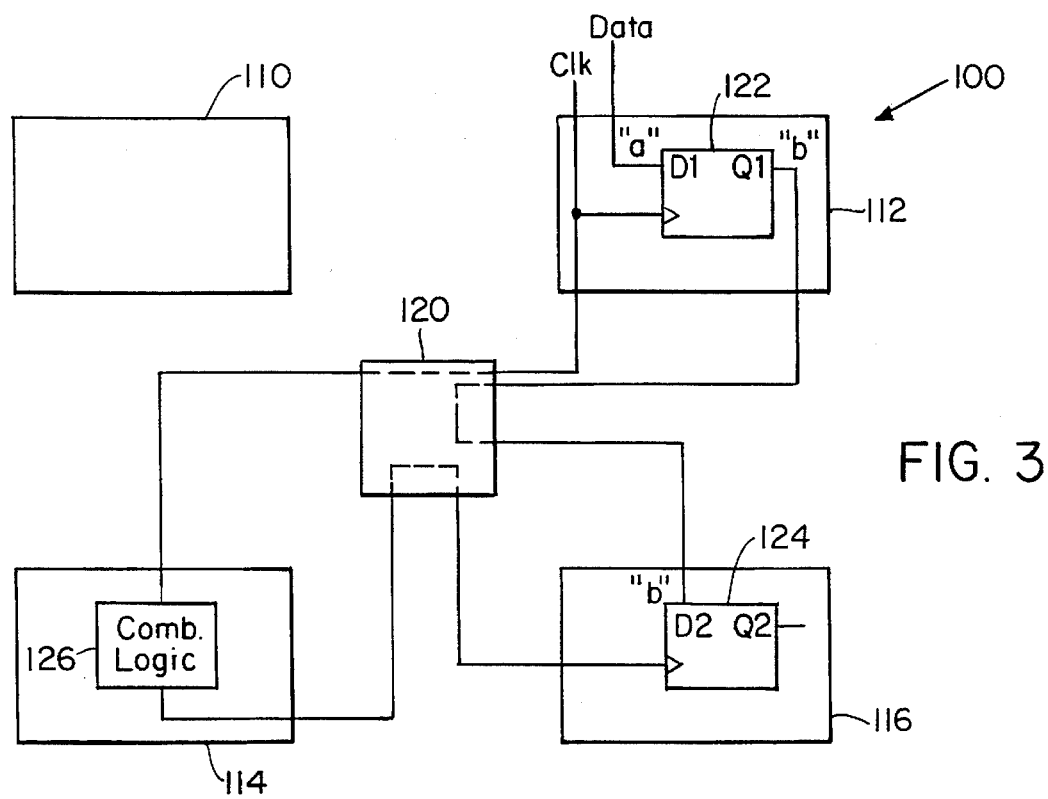
FIG. 3 is a schematic diagram of a configurable logic system that comprises four configurable logic devices—a portion of the internal logic structure of these devices has been shown to illustrate the origins of hold time violations.

FIG. 3 illustrates the origins of hold time problems in conventional logic designs. The description is presented in the specific context of a configurable system 100, such as an emulation system, comprising four configurable logic devices 110–116, such as FPGAs, which are interconnected via a crossbar 120 interconnect. A portion of the internal logic of these devices is shown to illustrate the distribution of a gated clock and the potential problems from the delay of the clock.

The second logic device 112 has been programmed with a partition of the intended logic design that includes an edge-triggered D-type flip-flop 122. This flip-flop 122 receives a data signal DATA at an input terminal D1 and is clocked by a clock signal CLK, both of which are from the environment in which the system 100 is intended to operate. The output terminal Q1 of the first flip-flop is connected to a second flip-flop 124 in the fourth logic device 116 through the crossbar 120. This second flip-flop 124 is also clocked by the clock signal, albeit a gated version that reaches the second flip-flop 124 through the crossbar 120, through combinational logic 126 on a third configurable logic device 114 and through the crossbar 120 a second time before it reaches the clock input of the second flip-flop 124.

Ideally, the rising edge of the clock signal should arrive at both the first flip-flop 122 and the second flip-flop 124 at precisely the same time. As a result of this operation, the logic value "b" held at the output terminal Q1 of the first flip-flop 122 and appearing at the input terminal D2 of the second flip-flop 124 will be latched to the output terminal Q2 of the second flip-flop 124 as the data input is latched by flip-flop 122. The output terminals Q1 and Q2 of the flip-flops 122, 124 will now hold the new output values "a" and "b". This operation represents correct synchronous behavior.

The more realistic scenario, especially when gated clocks are used, is that the clock signal CLK will not reach both of the flip-flops 122 and 124 at the same instant in time. This realistic assumption is especially valid in the illustrated example in which the clock signal CLK must pass through the combinational logic 126 on the third configurable logic device 114 before it reaches the second flip-flop 124 on the fourth configurable logic device 116. In this example, assume the clock signal CLK reaches the first flip-flop 122 in the second configurable logic device 112 and clocks the value at that flip-flop's input terminal D1 to the output Q1. At some point, the output Q1 of the first flip-flop is now holding the new value "a" and this new value begins to propagate toward the input D2 of the second flip-flop 124. The rising edge of the clock signal CLK has not propagated to the second flip-flop 124 on the fourth configurable logic device 116, however. Instead, a race of sorts is established between the rising edge of the clock signal CLK and the new value "a" to the second flip-flop 124. If the new value "a" reaches the input terminal D2 of the second flip-flop before the rising edge of the clock signal CLK, the old value "b" will be over-written. This is incorrect behavior since the information contained in "b" is lost. For correct operation of the circuit, it was required that signal "b" at the input terminal D2 of the second flip-flop 124 be held valid for a brief period of time after the arrival of the clock edge to satisfy a hold time requirement. Unfortunately, unpredictable routing and logic delays postpone the clock edge beyond the validity period for the input signal "b".

In environments where delays can not be predicted precisely, hold time violations are a serious problem that can not be rectified merely by stretching the length of the clock period. Often, there is a need for careful delay tuning in traditional systems, either manually or automatically, in which analog delays are added to signal paths in the logic. The delays usually require further decreases in the operational speed of the target system. This lengthens the periods of the environmental timing signals and gives the emulation system more time to perform the logic calculations. These changes, however, create their own timing problems, and further erode the overall speed, ease-of-use, and predictability of the system.

Figure 4B:
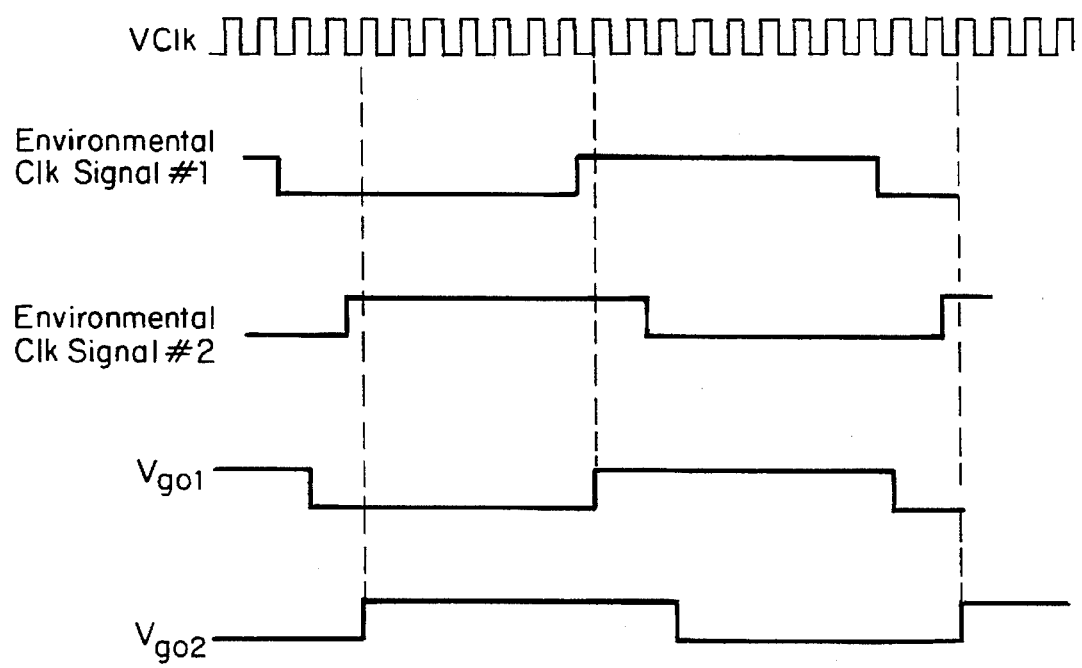
FIG. 4B is a timing diagram showing the timing relationships between the internal or virtual clock signal, environmental timing signals, and control signals generated by the logic system.
Figure 4A:
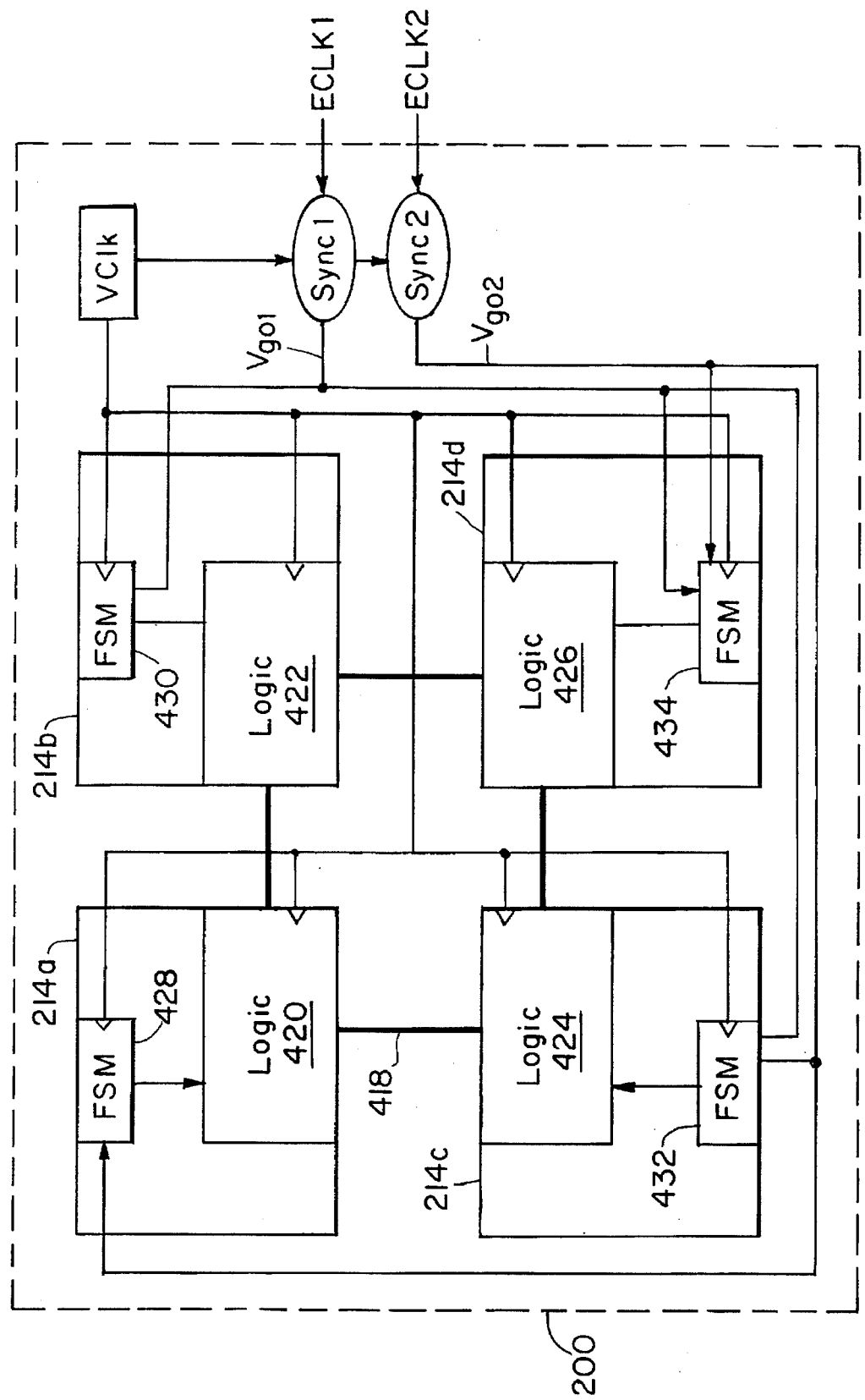
FIG. 4A is a schematic diagram of the logic system of the present invention showing the internal organization of the configurable logic devices and the global control of the logic devices by the internal or virtual clock.

FIG. 4A is a schematic diagram showing the internal architecture of the logic system 200 which has been configured according to the principles of the present invention. This logic system 200 comprises a plurality of configurable logic devices 214a–214d. This, however, is not a strict necessity for the invention. Instead, the logic system 200 could also be constructed from a single logic device or alternatively from more than the four logic devices actually shown. The logic devices are shown as being connected by a Manhattan style interconnect 418. Again, the interconnect is non-critical, modified Manhattan-style, crossbars or hierarchial interconnects are other possible and equivalent alternatives.

The internal logic architecture of each configurable logic device 214a–214d comprises a finite state machine 428–434 and logic 420–426. An internal or virtual clock VClk generates an internal or virtual clock signal that is distributed through the interconnect 418 to each logic device 214a–214d, and specifically, the logic 420–426 and finite state machines 428–434. Generally, the logic 420–426 performs the logic operations and state transitions associated with the logic design that was developed from the digital circuit description. The finite state machines 428–434 control the sequential operations of the logic in response to the signal from the virtual clock VClk.

The logic system 200 operates synchronously with the single internal clock signal VClk. Therefore, a first synchronizer SYNC1 and a second synchronizer SYNC2 are provided to essentially generate synchronous versions of timing signals from the environment. In the illustrated example, they receive environmental timing signals EClk1 and EClk2, respectively. The synchronizers SYNC1 and SYNC2 also receive the internal clock signal VClk. Each of the synchronizers SYNC1 and SYNC2 generates a synchronizing control signal $V_{GO1}$, $V_{GO2}$ in response to an edge of the respective environmental timing signal EClk1 and EClk2, upon the next transition of the internal clock VClk. Thus, these control signals are synchronous with the internal clock.

FIG. 4B shows an exemplary timing diagram of the virtual clock signal VClk compared with a first environmental clock signal EClk1 and a second environmental clock signal EClk2. As shown, typically, the virtual clock VClk is substantially faster than any of the environmental clocks, at least four times faster but usually faster by a factor of ten to twenty. As a general rule, the temporal resolution of the virtual clock, i.e., the cycle time or period of the virtual clock, should be smaller than the time difference between any pair of environmental timing signal edges.

In the example, the environmental clocks EClk1 and EClk2 are rising edge-active. The signals $V_{GO1}$ and $V_{GO2}$ from the first synchronizer SYNC1 and the second synchronizer SYNC2, respectively, are versions of the environmental clock which are synchronized to the internal clock VClk in duration. The transitions occur after the rising edges of the environmental clocks EClk1 and EClk2, upon the next or a later rising edge of the internal clock. For example, the second synchronizing signal $V_{GO2}$ is active in response to the receipt of the second environmental clock signal EClk2 upon the next rising edge of the internal clock VClk.

Returning to FIG. 4A, in typical simulation or emulation configurable systems and the present invention, logic of the configurable devices include a number of interconnected combinational components that perform the boolean functions dictated by the digital circuit design. An example of such components are logic gates. Other logic is configured as sequential components. Sequential components have an output that is a function of the input and state and are clocked by a timing signal. An example of such sequential components would be a flip-flop. In the typical configurable systems, the environmental clock signals are provided to the logic in each configurable logic device to control sequential components in the logic. This architecture is a product of the emulated digital circuit design in which similar components were also clocked by these timing signals. The present invention, however, is configured so that each one of these sequential components in the logic sections 420–426 is clocked by the internal or virtual clock signal VClk. This control is schematically shown by the distribution of the internal clock signal VClk to each of the logic sections 420–426 of the configurable devices 410–416. As described below, the internal clock is the sole clock applied to the sequential components in the logic sections 420–426 and this clock is preferably never gated.

Finite state machines 428–434 receive both the internal clock signal VClk and also the synchronizing signals $V_{GO1}$ $V_{GO2}$ from the synchronizers SYNC1 and SYNC2. The finite state machines 428–434 of each of the configurable logic devices 410–416 generate control signals to the logic sections 420–426. These signals control the operation of the sequential logic components. Usually, the control signals are received at load enable terminals. As a result, the inherent functionality of the original digital circuit design is maintained. The sequential components of the logic are operated in response to environmental timing signals by virtue of the fact that loading occurs in response to the synchronized versions of the timing signals, i.e. $V_{GO1}$ $V_{GO2}$. Synchronous operation is imposed, however, since the sequential components are actually clocked by the single internal clock signal VClk throughout the logic system 200. In contrast, the typical simulation or emulation configurable systems would clock the sequential components with the same environmental clock signals as in the original digital circuit description.

It should be noted that separate finite state machines are not required for each configurable logic device. Alternatively, a single finite state machine having the combined functionality of finite state machines 428–434 could be implemented. For example, one configurable device could be entirely dedicated to this combined finite state machine. Generally, however, at least one finite state machine on each device chip is preferred. The high cost of interconnect bandwidth compared to on-chip bandwidth makes it desirable to distribute only the synchronizing signals $V_{GO1}$ $V_{GO2}$ to each chip, and generate the multiple control signals on-chip to preserve the interconnect for other signal transmission.

Figure 5A:
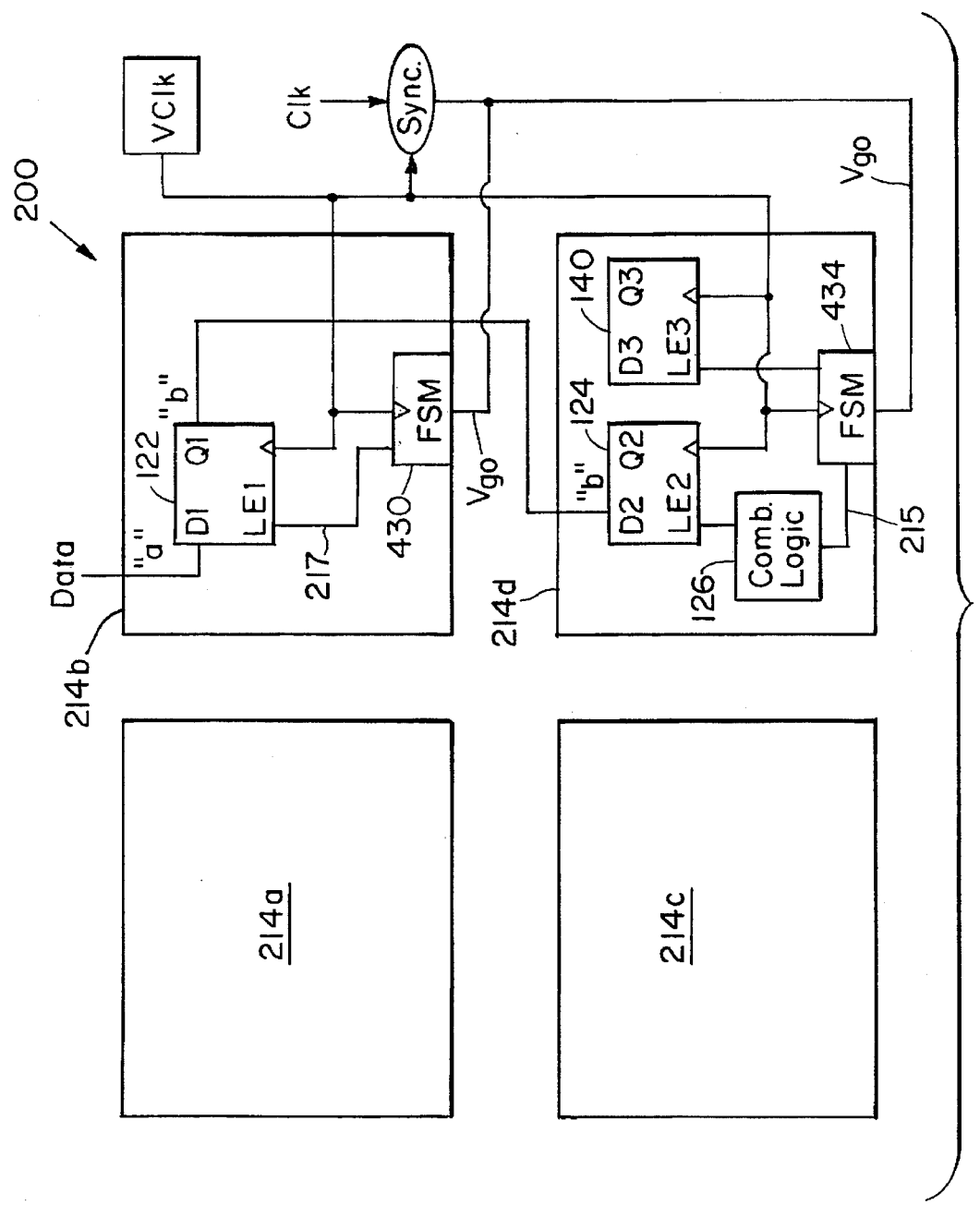
FIG. 5A is a schematic diagram of a logic system of the present invention that comprises four configurable logic devices, the internal structure of these devices is the functional equivalent of the structure shown in FIG. 3 except that the circuit has been resynthesized according to the principles of the present invention.

FIG. 5A shows a portion of a logic circuit that has been programmed into the logic system 200 according to the present invention. This logic circuit is a resynthesized version of the logic circuit shown in FIG. 3. That is, the logic circuit of FIG. 5A and of FIG. 3 have many of the same characteristics. Both comprise flip-flops 122 and 124. The flip-flop 122 has an output terminal Q1 which connects to the input terminal D2 of flip-flop 124. Further, the combinational logic 126 is found in both circuits.

The logic circuit of FIG. 5A differs from FIG. 3 first in that each of the flip-flops 122 and 124 are load-enable type flip-flops and clocked by a single internal clock VClk. Also, the environmental clock signal Clk is not distributed per se to both of the flip-flops 122 and 124 as in the circuit of FIG. 3. Instead, a synchronized version of the clock signal $V_{GO}$ is distributed to a finite state machine 430 of the second configurable logic device 214b and is also distributed to a finite state machine 434 of the fourth configurable logic device 214d. The finite state machine 430 then provides a control signal to a load enable terminal LE1 of flip-flop 122 and finite state machine 434 provides a control signal to the load enable terminal LE2 of flip-flop 124 through the combinational logic 126.

Figure 5B:
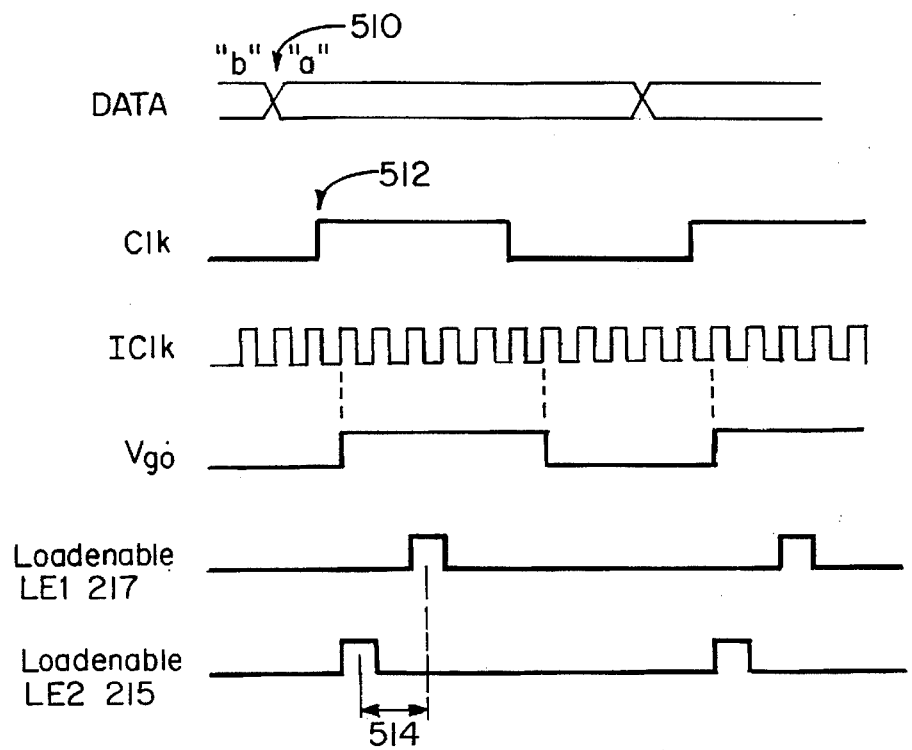
FIG. 5B is a diagram showing the timing relationship between the signals generated in the device of FIG. 5A.

FIG. 5B is a timing diagram showing the timing of the signals in the circuit of FIG. 5A. That is, at time 510, new data is provided at the input terminal D1 of flip-flop 522. Then, at some later time, 512, the clock signal Clk is provided to enable the flip-flop 122 to clock in this new data. The second flip-flop 124 is also intended to respond to the environmental clock signal Clk by capturing the previous output of flip-flop 122 before that flip-flop is updated with the new data. Recall that the problem in the logic circuit of FIG. 3 was that the clock signal to the second flip-flop 124 was gated by the combinational logic 126 which delayed that clock signal beyond time at which the output "b" from the output terminal Q1 of the flip-flop 122 was valid. In the present invention, the environmental clock signal Clk is received at the synchronizer SYNC. This synchronizer also receives the virtual clock signal VClk. The output of the synchronizer $V_{GO}$ is essentially the version of the environmental clock signal that is synchronized to the internal clock signal. Specifically, the new signal $V_{GO}$ has rising and falling edges that correspond to the rising edges of the internal clock signal VClk.

The finite state machines 430 and 434 are individually designed to control the flip-flops in the respective configurable logic 214b and 214d to function as required for correct synchronous operation. Specifically, finite state machine 434 generates a control signal 215 which propagates through the combinational logic 126 to the load enable terminal LE2 of the flip-flop 124. This propagation of control signal 215 from finite state machine, through combinational logic 126, to LE2 occurs in a single virtual clock cycle. The generation of control signal 215 precedes the generation of control signal 217 by the finite state machine 430 by a time of two periods (for example) of the internal clock VClk. This two cycle difference, 514, assumes that flip-flop 124 is enabled before flip-flop 122 is enabled, thereby latching "b", and thus providing correct operation. As a result, both flip-flop 122 and flip-flop 124 are load enabled in a sequence that guarantees that a new value in flip-flop 122 does not reach flip-flop 124 before flip-flop 124 is enabled. In fact, if the compiler has scheduled "b" to arrive at D2 on some cycle, x, later than 217, then the compiler can cause control signal 215 to be available on that cycle x, or later. In the above instance, the correct circuit semantics is preserved even though control signal 215 arrives after control signal 217. The key is that 215 must enable flip-flop 124 in a virtual cycle in which "b" is at D2.

Further, the precise control of storage elements afforded by the present invention allows set up and hold times into the target system to be dictated. In FIG. 5A, output Q2 of flip-flop 124 is linked to a target system via a third flip-flop 140. The flip-flop 140 is load enabled under the control of finite state machine 434 and clocked by the virtual clock. Thus, by properly constructing this finite state machine 434, the time for which flip-flop 140 holds a value at terminal Q3 is controllable to the temporal resolution of a cycle or period of the virtual clock signal.

This aspect of the invention enables the user to test best case and worst case situations for signal transmission to the target system and thereby ensure that the target system properly captures these signals. In a similar vein, this control also allows the user to control the precise time of sampling signals from the target system by properly connected storage devices.

Figure 6:
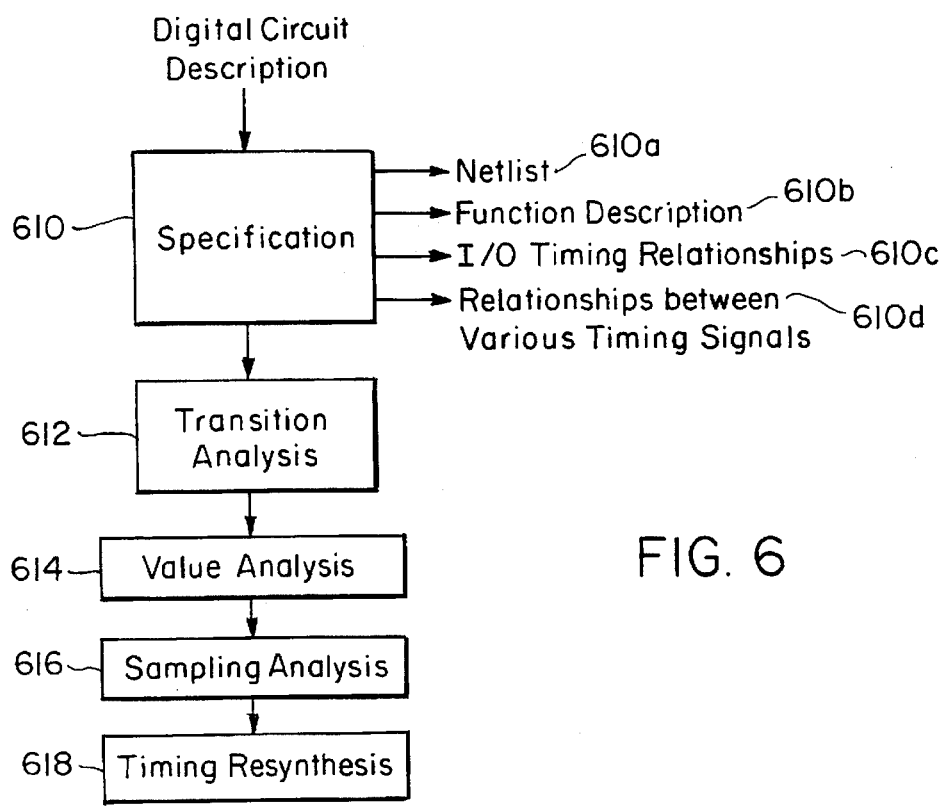
FIG. 6 illustrates a method by which a digital circuit description having an arbitrary clocking methodology is resynthesized into a functionally equivalent circuit that is synchronous with a single internal clock.

FIG. 6 illustrates a method by which a digital circuit design with an arbitrary clocking methodology and state elements is transformed into a new circuit that is synchronous with the internal clock signal but is a functional equivalent of the original digital circuit. The state elements of the new circuit are exclusively edge triggered flip-flops.

The first step is specification 610. This is a process by which the digital circuit design along with all of the inherent timing methodology information required to precisely define the circuit functionality is identified. This information is expressed in four pieces, a first piece of which is the gate-level circuit netlist 610a. This specifies the components from which the digital circuit is constructed and the precise interconnectivity of the components.

The second part 610b of the specification step 610 is the generation of a functional description of each component in the digital circuit at the logic level. For combinatorial components, this is a specification of each output as a boolean function of one or more inputs. For example, the specification of a three input OR gate—inputs A, B, and C and an output O—is O=A+B+C. For sequential components, this entails the specification of outputs as a boolean function of the inputs and state. The specification of the new state as a boolean function of the inputs and state is also required for the sequential components along with the specification of when state transitions occur as a function of either boolean inputs or directed input transitions. A directed input transition is a rising or falling edge of an input signal, usually a timing signal from the environment in which the logic system 200 is intended to ultimately function. For example, the specification of a rising edge-triggered flip-flop—inputs D, CLK, of output Q, and state S— is Q=S, S=D, and state transition when CLK rises.

Another part of the specification step is the description of the timing relationships of the inputs to the logic system step 610c. This includes environment timing signals and environmental input signals and the relationship to the output signals generated by the logic system 200 to the environment. Input signals to the logic system 200 can be divided into two classes: timing signals and environmental data signals. The timing signals are generally environmental clock signals, but can also be asynchronous resets and any other form of asynchronous signal that combinatorially reach inputs of state elements involved in the functions triggering state transitions. In contrast, environmental data signals include environmental output signals and output signals to the environment that do not combinatorially reach transition controlling inputs of state elements. The timing relationship also specify the timing of environmental data signals relative to a timing signal.

The specification step must also include the specification of the relative timing relationships for all timing signals step 610d. These relationships can be one of three types:

A basket of timing signals can be phase-locked. Two signals of equal frequency are phase-locked if there is a known phase relationship between each edge of one signal and each edge of the other signal. For example, the first environmental clock signal and the second environmental clock signal illustrated in FIG. 4 would be phase-locked signals. Additionally, two signals of integrally related frequency are phase-locked if there is a known phase relationship, relative to the slower signal, between any edge of the slower signal and each edge of the faster signal. Two signals of rationally related frequency are phase-locked if they each are phase-locked to the same slower signal.

Another type of timing relationship is non-simultaneous. Two signals are non-simultaneous if a directed transition in one signal guarantees that no directed transition will occur in the other within a window around the transition of some specified finite duration. If two signals are non-simultaneous and also not phase-locked, this implies that one signal is turned off while the other is on and vice versa. For example, two non-simultaneous signals might be two signals that indicate the mutually exclusive state of some component in the environment. The first signal would indicate if the component was in a first condition and the second timing signal would indicate if the component were in a second condition and the first and second condition could never happen at the same time.

Finally, the last type of relationship is asynchronous. Two signals are asynchronous if the knowledge about a directed transition of one of the signals imparts no information as to occurrence of a transition in the other signal.

It should be recognized that phase-locked is a transitive relationship so that there will be collections of one or more clocks that are mutually phase-locked with respect to each other. Such collection of phase-locked clocks is referred to as a domain. Relationship between domains are either non-simultaneous or asynchronous. The timing signals must be decomposed into a collection of phase-locked domains, and the relationship between pairs of the resulting domains, either synchronous or non-simultaneous, must be specified.

The ordering of the edges of timing signals within each domain are also specified. For example, first CLK1 rises, then CLK2 rises, then CLK2 falls and then CLK1 falls.

A transition analysis step 612, value analysis step 614, and sampling analysis step 616 are used to determine when, relative to the times at which transitions occur on timing signals, signals within a digital circuit change value, and where possible, what these values are. Also determined is when the values of particular signals are sampled by state elements within the circuit as a separate analysis.

In the transition analysis step 612, a discrete time range is established for each clock domain including one time point for each edge of a clock within the domain. All edges within the domain are ordered and the ordering of time points corresponds to this ordering of edges.

In the value analysis step 614, the steady state characteristics of every wire in the digital circuit is determined for each discrete time range. Within a discrete time range, any wire within the digital circuit can either be known to be 0, known to be 1, known not to rise, known not to fall or known not to change, or a combination of not falling and not rising. A conservative estimate of the behavior of an output of a logic component can be deduced from the behavior of its inputs. Information about environmental timing signals and environmental data signals can be used to define their behavior. Based on the transition and value information of the inputs to the logic system corresponding information can be deduced for the outputs of each component. A relaxation algorithm is used, in which output values of a given component are recomputed any time an input changes. If the outputs in turn change, this information is propagated to all the places the output connects, since these represent more inputs which have changed. The process continues until no further changes occur.

A second relaxation process, similar to that for transition and value analysis, is used in the sampling step 616. Sampling information reflects the fact that at some point in time, the value carried on a wire may be sampled by a state element, either within the logic system 200 or by the environment. Timing information for output data signals to the environment provides an external boundary condition for this relaxation process. Additionally, once transition analysis has occurred, it is possible to characterize when all internal state elements potentially make transitions and thus when they may sample internal wires. Just as with transition and value propagation, the result is a relationship between inputs and outputs of a component. For sampling analysis, it is possible to deduce the sampling behavior of inputs of a component from the sampling information for its outputs. The relaxation process for computing sampling information thus propagates in the opposite direction from that of transition information, but otherwise similarly starts with boundary information and propagates changes until no further changes occur.

At the termination of transition 612 and sampling 616 steps it is possible to characterize precisely which timing edges can result in transitions and/or sampling for each wire within the digital circuit. Signals which are combinationally derived from timing signals with known values often also carry knowledge about their precise values during some or all of the discrete time range. They similarly often are known to only be able to make one form of directed transition, either rising or falling, at some particular discrete time point. This information is relevant to understanding the behavior of edge-triggered state elements.

The final resynthesis step 618 involves the application of a number of circuit transformations to the original digital circuit design which have a number of effects. First, the internal clock VClk is introduced into the logic design 200 of the digital circuit. The internal clock signal is the main clock of the logic system 200. Further, in effect, all of the original environmental timing signals of the digital circuit are converted into data signals in the logic system 200. Finally, all of the state elements in the digital circuit are converted to use the internal clock signal as their clock, leaving the internal clock as the only clock signal of the transformed system. The state elements of the original digital circuit design are converted preferably into edge-triggered flip-flops and finite state machines, which generate control signals to the load enable terminals of the flip-flops. The information developed in the transition analysis step 612, value analysis step 614, and sampling analysis step 616 is used to define the operation of the finite state machines as it relates to the control of the flip-flops in response to the internal clock signal and the environmental timing signals. The finite state machines send load enable signals to the flip-flops when it is known that data inputs are correct based upon a routing and scheduling algorithm described in the U.S. patent application Ser. No. 08/344,723 filed Nov. 23, 1994 and entitled "Pipe-Lined Static Router and Scheduler for Configurable Logic System Performing Simultaneous Communications and Computations", incorporated herein by this reference. The scheduling algorithm essentially produces a load enable signal on a virtual clock cycle that is given by the maximum of the sum of data, value available time, and routing delays for each signal that can affect data input.

Single Flip-Flop Timing Resynthesis

Figure 7A:
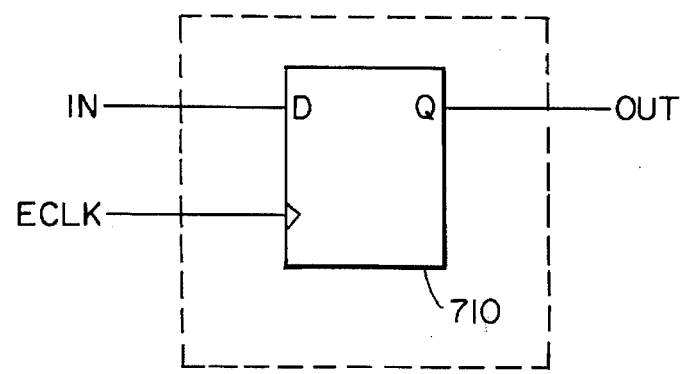
FIGS. 7A and 7B illustrate a timing resynthesis circuit transformation in which an edge-triggered flip-flop is converted into a load-enable type flip-flop.

FIG. 7A shows a simple edge-triggered flip-flop 710 which was a state element in the original digital circuit. Specifically, the edge-triggered flip-flop 710 receives some input signal at its input terminal D and some timing signal, such as an environmental clock signal ECLK at its clock input terminal. In response to a rising edge received into this clock terminal, the value held at the input terminal D is placed at the output terminal Q.

Figure 7B:
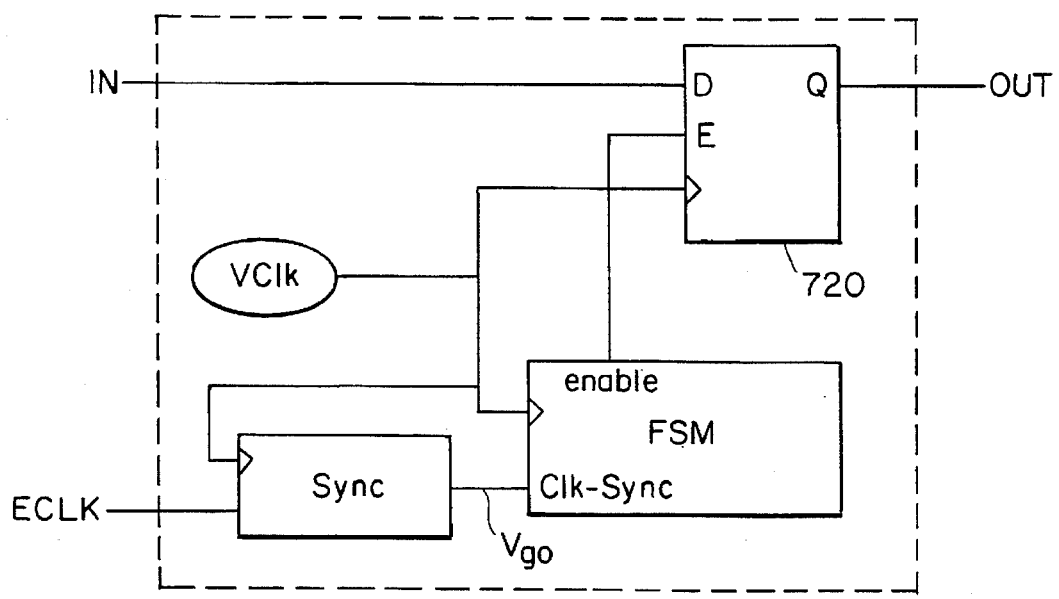

The timing resynthesis step converts this simple edge-triggered flip-flop 710 to the circuit shown in FIG. 7B. The new flip-flop is a load-enabled flip-flop and is clocked by the internal clock signal VClk. The enable signal of the converted flip-flop is generated by a finite state machine FSM. Specifically, the finite state machine monitors a synchronized version of the clock signal $V_{GO}$ and asserts the enable signal to the enable input terminal E of the converted flip-flop 720 for exactly one cycle of the internal clock VClk in response to synchronizing signal $V_{GO}$ transitions from 0 to 1. The finite state machine is programmed so that the enable signal is asserted on an internal clock signal cycle when the input IN is valid accounting for delays in the circuit that arise out of a need to route the signal IN on several VClk cycles from the place it is generated to its destination at the input of flip-flop 720. In a virtual wire systems signals are routed among multiple FPGAs on specific internal clock VClk cycles. The synchronizing signal $V_{GO}$ is generated by a synchronizer SYNC in response to receiving the environmental timing signal EClk on the next or a following transition of the internal clock signal VClk. As a result, the circuit is functionally equivalent to the original circuit shown in FIG. 7A since the generation of the enable signal occurs in response to the environmental clock signal EClk each time a transition occurs. The circuit, however, is synchronous with the internal clock VClk.

In a digital circuit comprising combinational logic and a collection of flip-flops, all of which trigger off the same edge of a single clock, the basic timing resynthesis transformation, shown in FIG. 7B and described above, can be extended. All flip-flops are converted to load-enabled flip-flops and have their clock inputs connected to the internal clock VClk. The load enable terminal E of each flip-flop is connected to enable signals generated by a shared finite state machine in an identical manner as illustrated above. The FSM can be distinct for each FPGA. The enables for each flip-flop will be produced to account for routing delays associated with each signal input to the flip-flops.

Timing Resynthesis for Domains for Multiple Clocks

Figure 8A:
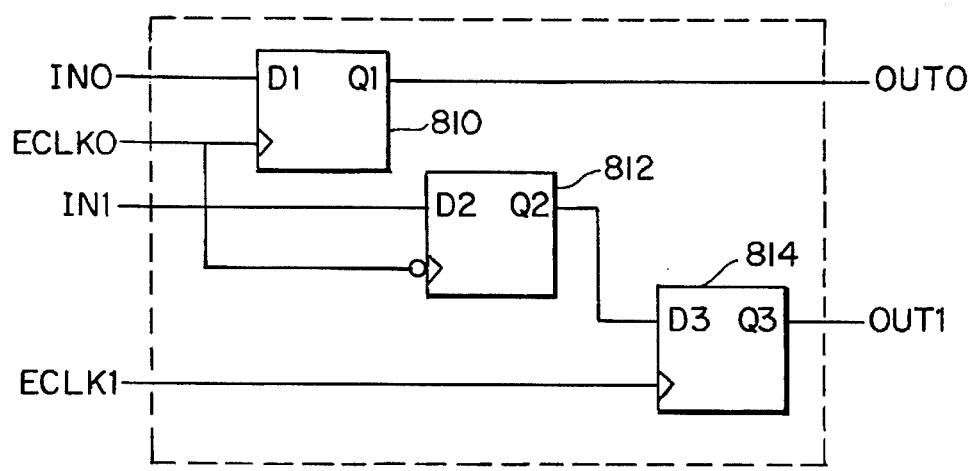
FIGS. 8A and 8B illustrate a timing resynthesis circuit transformation in which a plurality of edge triggered flip-flops clocked by two phase-locked clock signals are converted into load enable flip-flops that are synchronous with the internal clock signal.

FIG. 8A shows a circuit comprising three flip-flops 810–814 that are clocked by two environmental clock signals EClk0 and EClk1. For the purposes of this description, both environmental clock signals EClk0 and EClk1 are assumed to be phase-locked with respect to each other.

Figure 8B:
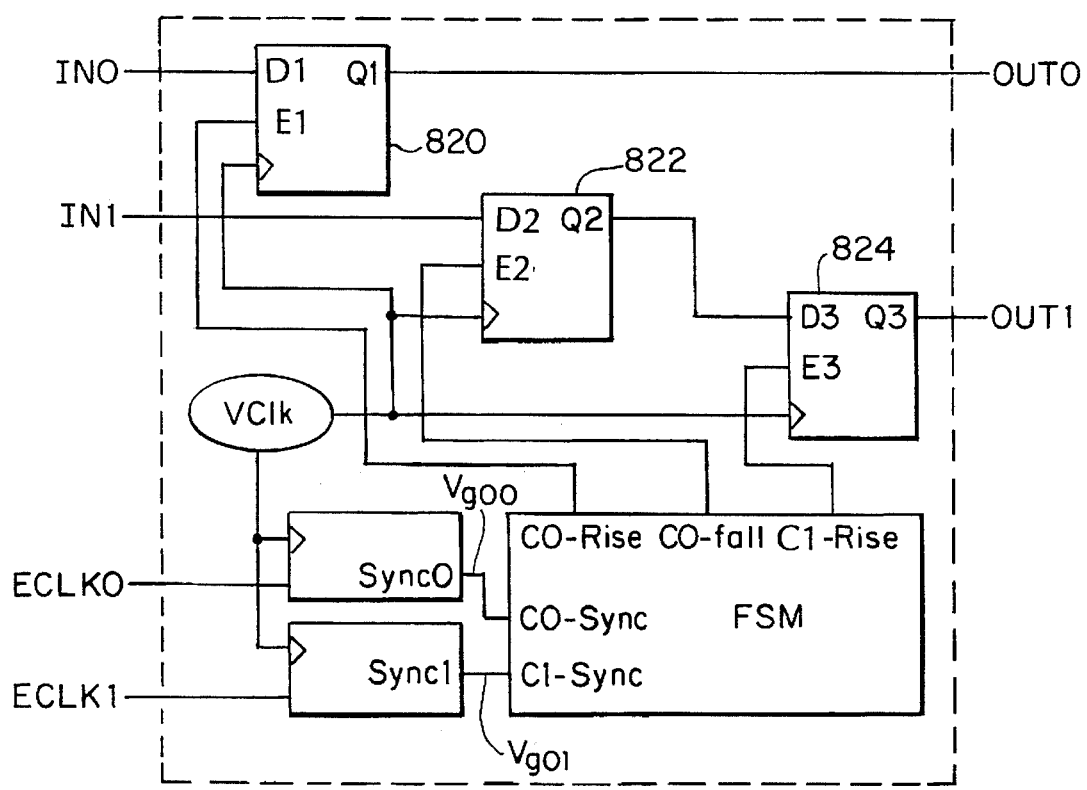

The transformed circuit is shown in FIG. 8B. It should be noted that the basic methodology of the transform is the same as described in relation to FIGS. 7A and 7B. The finite state machine FSM and the clock sampling circuitry SYNC1 and SYNC2 have been extended. As before, each flip-flop of the transformed circuit has been replaced with a load-enabled positive-edge triggered flip-flop 820–824 in the transformed circuit. The first environmental clock signal EClk0 and the second environmental clock signal EClk1 are synchronized to the internal clock by the first synchronizer SYNC0 and the second synchronizer SYNC1. The synchronizing signals $V_{GO0}$ and $V_{GO1}$ are generated by the synchronizers SYNC0 and SYNC1 to the finite state machine FSM. The finite state machine FSM watches for the synchronizing signals $V_{GO0}$ and $V_{GO1}$ and then produces a distinct load enable pulse C0-Rise, C0-Fall, C1-Rise for each timing edge on which the clocks EClk0 and EClk1 of the flip-flops 820–824 operate. The ordering of these load enable pulses is prespecified within a domain where there is a unique ordering of the edges of all phase-locked clocks. This unique ordering of clocks is specified by the user of the system. As with the single clock case shown in FIG. 7B, each of the enable pulses C0-Rise, C0-Fall, and C1-Rise is asserted for exactly one period of the internal clock VClk upon detection of the corresponding clock edge in FIG. 8B.

Multiple Clock Domains Resynthesis

Figure 9A:
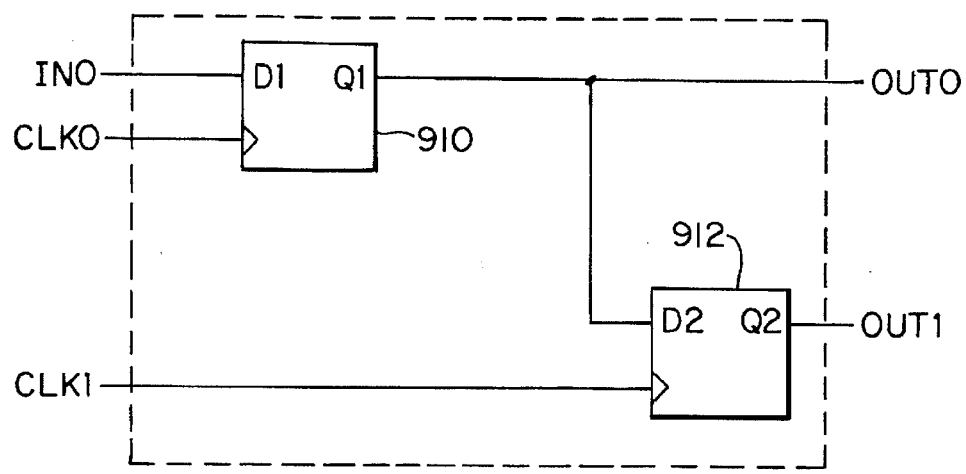
FIGS. 9A and 9B illustrate a timing resynthesis circuit transformation in which two edge triggered flip-flops clocked by two arbitrary clock signals are transformed into load enabled flip-flops that operate synchronously with the internal clock signal.

FIG. 9A shows a collection of flip-flops 910–912 from the digital circuit having multiple clock domains. That is, the first clock signal CLK0 and the second clock signal CLK1 do not have a phase-locked relationship to each other, rather the clocks are asynchronous with respect to each other.

Figure 9B:
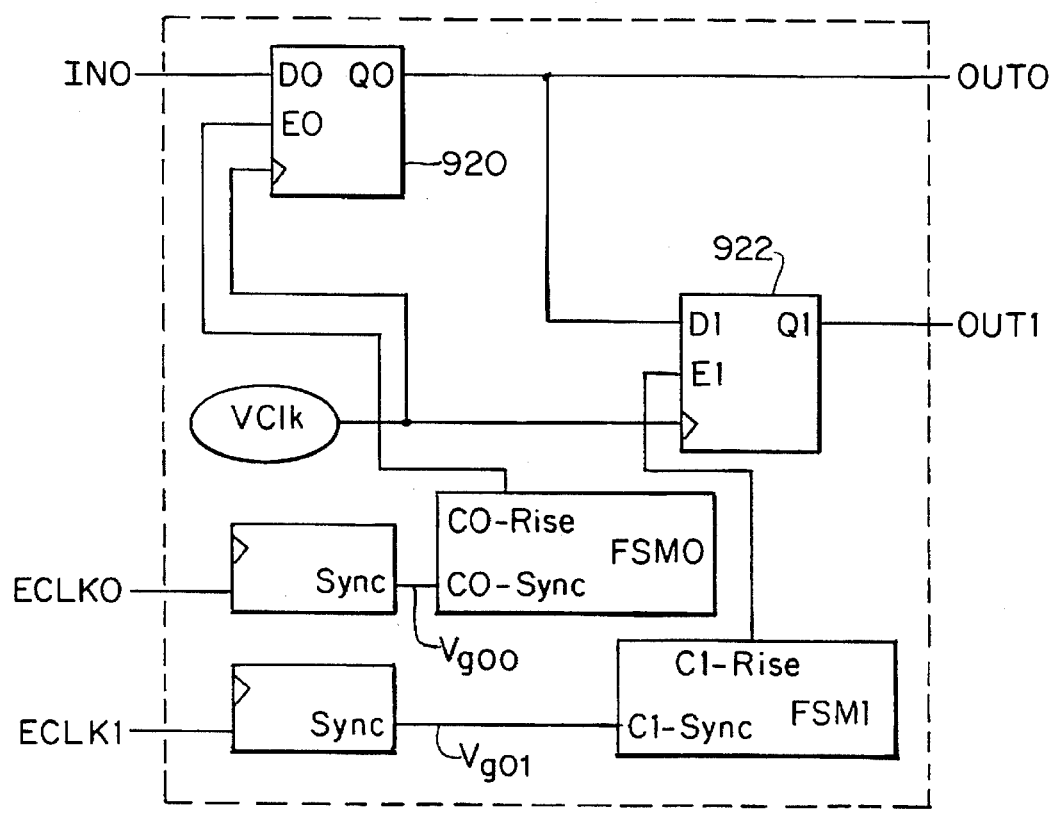

FIG. 9B shows the transformed circuit. A different finite state machine FSM0 and FSM1 is assigned to each domain. Specifically, a first finite state machine FSM0 is synchronized to the first environmental clock EClk0 to generate the load enable signal to the load enable terminal E0 of the first flip-flop 920. The second finite state machine FSM1 generates a load enable signal to E1 of the second flip-flop 922 in response to the second environmental clock signal EClk1. It should be noted, however, that although FSM0 and FSM1 operate independently of each other, each of whose sequences are initiated by separate signals $V_{g00}$ and $V_{g01}$, and that although the first flip-flop 920 and the second flip-flop 922 work independently of each other, i.e., load enabled by different clock signals EClk0 and EClk1, the resulting system is a single-clock synchronous system with the internal clock VClk.

The relationship between the behavior of the first finite state machine FSM0 and the second finite state machine FSM1 of the two clock signal domains is related to the relationship between the domains themselves. When the two domains are asynchronous, the first finite state machine FSM0 and the second finite state machine FSM1 may operate simultaneously or non-simultaneously. When the two domains are non-overlapping, the first finite state machine FSM0 and the second finite state machine FSM1 never operate simultaneously since the edges within the domains are separated in time.

The simultaneity of operation of finite state machines that are asynchronous with respect to each other leaves two circuits which can not readily be transformed by timing resynthesis. A state element which can undergo transitions as a result of an edge produced from a combination of signals in asynchronously related domains can not be resynthesized. Such condition can rise if two asynchronous clocks are gated together and fed into the clock input of a flip-flop or if a state element with multiple clocks and/or asynchronous presets or clears is used as transition triggering inputs from distinct asynchronously related clock domains. Due to the non-simultaneous events and non-overlapping domains, the situations above are not problematic in the non-overlapping situation.

Gated Clock Transformations

Clock gating in the digital circuit provides additional control over the behavior of state elements by using combinational logic to compute the input to clock terminals. The timing resynthesis process transforms gated clock structures into functionally equivalent circuitry which has no clock gating. Generally, gated clock structures can be divided into two classes: simple gated clocks and complex gated clocks. The basis for this distinction lies in the behavior of the gated clocks as deduced from timing analysis. Previously, the terms timing signal and data signal were defined in the context of inputs and outputs to the digital circuit. A gated clock is a combinational function of both timing signals and data signals. The gated clock transition then controls the input of a state element. Data signals can either be external input data signals from the environment or internally generated data signals.

A simple gated clock has two properties:
1) at any discrete time it is possible for a simple gated clock to make a transition in at most one direction, stated differently, there is no discrete time at which the simple gated clock may sometime rise and sometime fall; and
2) only timing signals change at those discrete times at which state elements can change state.

A complex gated clock violates one of these two properties.

Simple Gated Clock Transformation

Figure 10A:
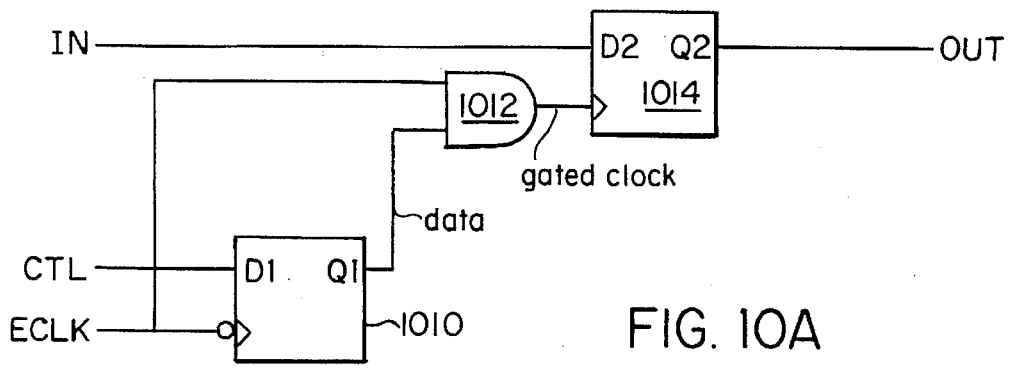
FIGS. 10A, 10B, and 10C illustrate a timing resynthesis circuit transformation in which two edge-triggered flip-flops, one of which is clocked by a gated clock, are transformed into two load-enable flip-flops that operate synchronously with the internal clock signal.
Figure 10B:
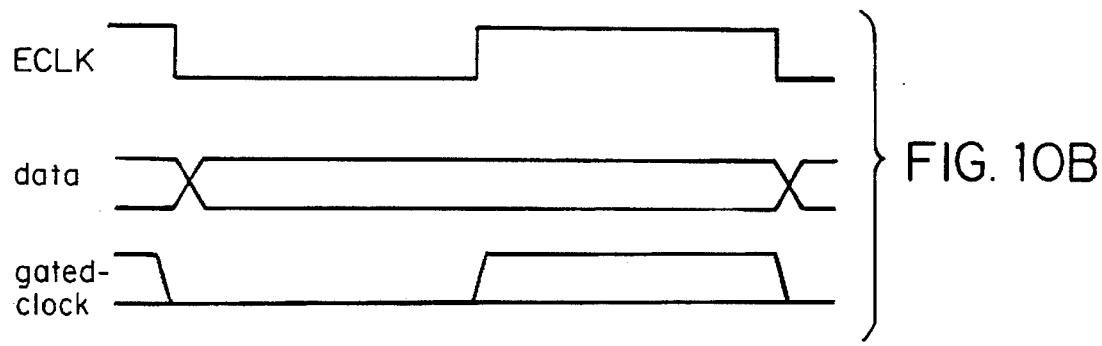

FIG. 10A shows a circuit that exhibits a simple gated clock behavior. FIG. 10B is a timing diagram showing transitions in the data signal and the gated clock signal as a function of the environmental clock signal EClk. Specifically, upon the falling edge of the environmental clock EClk, the gating flip-flop 1010 latches the control signal CTL received at its input D1 at its output terminal Q1. This is the data signal. The AND gate 1012 receives both the data signal and the environmental clock EClk. As a result, only when the environmental clock EClk goes high, does the gated-clock signal go high on the assumption that the data signal is also a logic high. Upon the rising edge of the gated clock, the second flip-flop 1014 places the input signal IN received at its D2 terminal to its output terminal Q2.

Figure 10C:
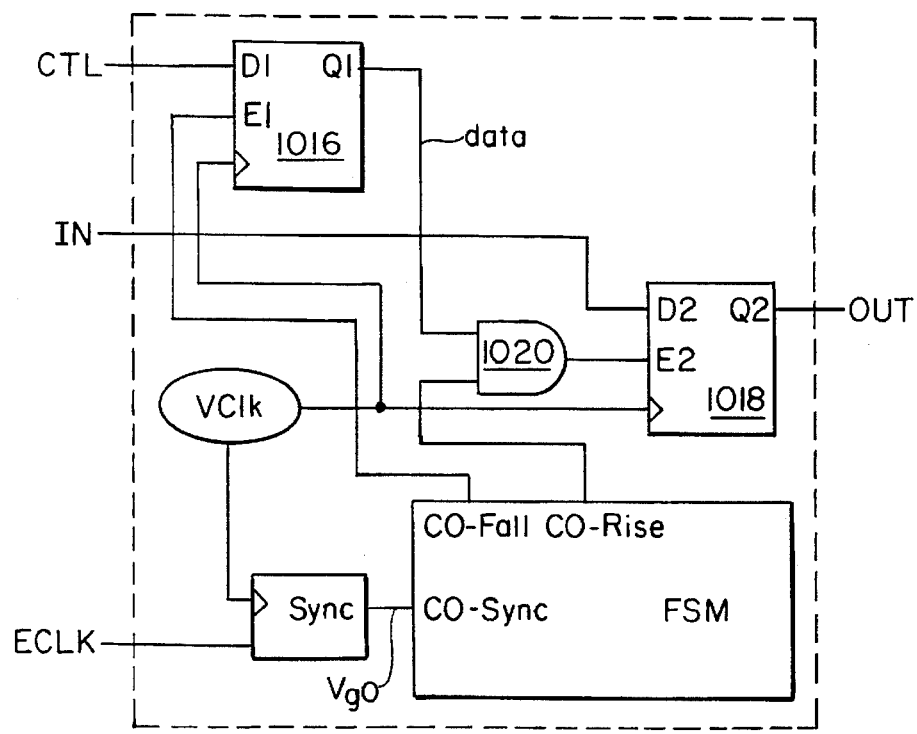

FIG. 10C shows the transformed circuit. Here, a finite state machine FSM receives a signal $V_{GO}$ from the synchronizer SYNC upon receipt of the environmental clock EClk. The finite state machine FSM produces two output signals: C0-Fall which is active upon the falling edge of the environmental clock signal, and C0-Rise which is active upon the rising of the environmental clock signal EClk.

The transformed circuit functions as follows. On the first period of the internal clock VClk after the falling edge of the environmental clock signal EClk, the first flip-flop 1016 places the value of the control signal received at its input terminal D1 to its output terminal Q1 upon the clocking of the internal clock signal VClk. This output of the first flip-flop 1016 appearing at terminal Q1 corresponds to the data signal in the original circuit. This data signal is then combined in an AND gate 1020 with the signal C0-Rise from the finite state machine FSM that is indicative of the rising edge of the environmental clock signal EClk. The output of the AND gate goes to the load enable terminal E2 of a second flip-flop 1018 which receives signal IN at its input terminal D2. Again, upon the receipt of this load enable and upon the next cycle of the internal clock VClk, the second flip-flop moves the value at its input terminal D2 to its output terminal Q2.

Complex Gated Clock Transformations

In the case of complex gated clock behavior, the factoring technique used for simple gated clock transformations is inadequate. Because data and clocks change simultaneously and/or the direction of a transition is not guaranteed, both the value of a gated clock prior to the transition time and the value of the gated clock after the transition time are needed. Using these two values, it can be determined whether a signal transition that should trigger a state change has occurred. One way to produce the post-transition value of data signals is to replicate the logic computing the signal and also replicate any flip-flops containing values from which the signal is computed and which may change state as a result of the transition. These replica flip-flops can be enabled with an early version of the control signal, thus causing them to take on a new state prior to the main transition. By this mechanism, pre- and post-transition values for signals needed for gated clocks can be produced.

An alternative way to get the two required values for the gated clock signal is to add a flip-flop to record the pre-transition state of the gated-clock and delay in time the update of the state element dependent on the gated clock. These two techniques have different overhead costs and the latter is only applicable if the output of the state element receiving the gated clock is not sampled at the time of the transition. The former always works but the latter generally has lower overhead when applicable.

Figure 11A:
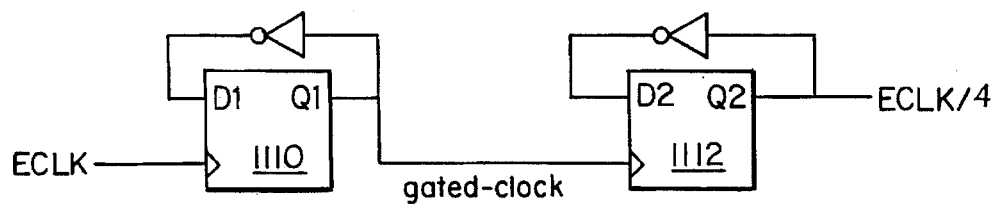
FIG. 11A and 11B illustrate a timing resynthesis circuit transformation in which a complex gated clock structure, with a second flip-flop being clocked by a gated clock, is converted into a circuit containing three flip-flops and an edge detector, all of the flip-flops operating off of the internal clock signal in the new circuit.

FIG. 11A shows two cascaded edge-triggered flip-flops 1100 and 1112. This configuration is generally known as a frequency divider. The environmental clock signal EClk is received at the clock terminal of the first flip-flop 1110; and at the output Q2 of the second flip-flop 1112, a new clock signal is generated that has one-fourth the frequency of EClk. The divider of FIG. 11A operates as follows: In an initial state in which the output terminal Q1 of the first flip-flop 1110 is a 0 and the input terminal D1 of the flip-flop 1110 is a 1, receipt of the rising edge of the environmental timing signal EClk changes Q1 to a 1 and D1 converts to a 0. The conversion of Q1 from 0 to 1 functions as a gated clock to the clock input terminal of the second flip-flop 1112. The second flip-flop 1112 functions similarly, but since it is only clocked when Q1 of the first flip-flop 1110 changes from 0 to 1, but not 1 to 0, it changes with one-fourth the frequency of EClk.

Figure 11B:
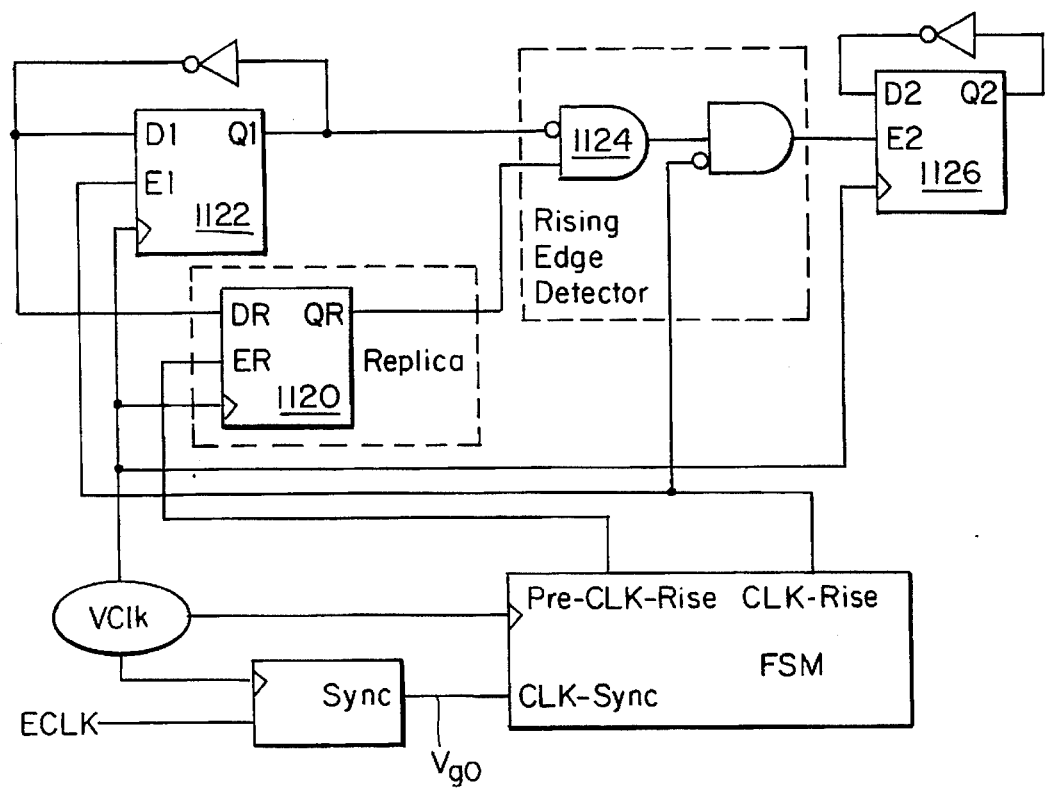

FIG. 11B shows the transformed circuit of FIG. 11A. Here, a replica flip-flop 1120 has been added that essentially mimics the operation of the first flip-flop 1122. The replica flip-flop 1120, however, receives a pre-Clk-Rise control signal from the finite state machine FSM. More specifically, the finite state machine FSM responds to the synchronizing signal $V_{GO}$ and the internal clock VClk and produces a pre-CLK-rise signal that is active just prior to the CLK-Rise signal, CLK-Rise being active in response to the rising edge of the environmental timing signal EClk. Assume the output terminal Q1 of the first flip-flop 1122 is initially at a 0 and the input terminal D1 of first flip-flop 1122 is a 1, the replica flip-flop 1120 is initially at a 0. Upon receipt of the pre-CLK-rise signal at the replica flip-flop load enable terminal ER, the output terminal QR of the replica flip-flop 1120 makes a transition from a 0 to a 1. Since Q1 is low and QR is high, an AND gate 1124 functioning as an edge detector generates a high signal. When the CLK-rise control signal from the finite state machine FSM is active in response to receipt of the rising edge of the environmental clock signal EClk, the output terminal Q1 of the first flip-flop 1122 is converted from a 0 to a 1. The enable terminal E2 of flip-flop 1126 also is high, causing the flip-flop to change state. On the next falling transition of Q1, the AND gate 1124 will produce 0 and flip-flop 1126 will not change state. Since the replica flip-flop 1120 provides a zero to the rising edge detector whenever the zero is present at the input terminal of the first flip-flop, the rising edge detector is enabled only every other transition of Q1.

Latch Resynthesis

Generally, latches are distinguished from flip-flops in that flip-flops are edge-triggered. That is, in response to receiving either a rising or falling edge of a clock signal, the flip-flop changes state. In contradistinction, a latch has two states. In an open state, the input signal received at a D terminal is simply transferred to an output terminal Q. In short, in an open condition, the output follows the input like a simple wire. When the latch is closed, the state of the output terminal Q is maintained or held independent of the input value at terminal D. A semantic characterization of such a latch is as follows. For an input D, output Q, a gate G, and a state S, Q=S. S=D if G=1. The latch is open when G=1 and closed when G=0.

Beginning with the simplest case, if the output of a latch is never sampled when the latch is closed, G=0, the latch is really just a wire. Latches with this characteristic may be used to provide extra hold time for a signal. For this sample latch, this would be true, if the set of discrete times at which the output of the latch is sampled, is equal to or a proper subset of the set of discrete times at which the gate signal G is known to have a value of 1. In this situation, the latch can be removed and replaced with a wire connecting the input and output signals.

In contrast, if the output of the latch is never sampled when the latch is open, the latch is equivalent to a flip-flop. The only value produced by the latch which is ever sampled is a value of the input D on the gate signal edge when the latch transitions from open to closed. This condition is true if the set of discrete times at which the output of the latch is sampled, is equal to, or a proper subset of the discrete times at which the gate signal G is known to have a value of 0. In this situation, the latch can be removed and replaced with an edge-triggered flip-flop.

Figure 12:
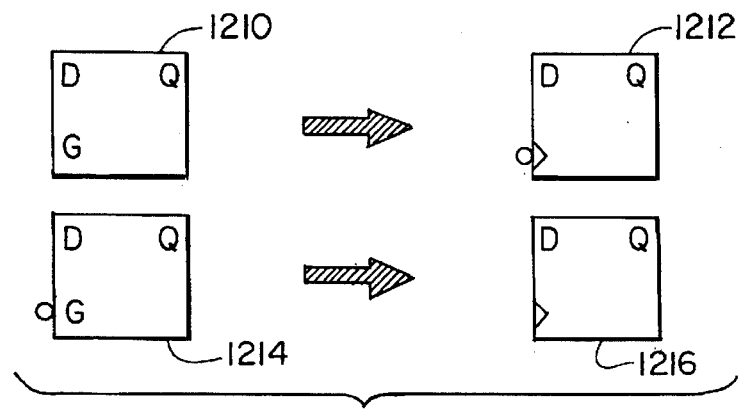
FIG. 12 illustrates circuit transformations in which gated latches are converted into edge-triggered flip-flops on the assumption that the latches are never sampled when open, i.e., latch output is not registered into another storage element when they are open.

As shown in FIG. 12, latches that are open when their gate signal G is high 1210 are converted to negative-edge triggered flip-flops 1212. Latches that are open when their gate signal G is low 1214 are converted to positive edge triggered flip-flops 1216.

Once the transition from the latch to the edge triggered flip-flop has been made, these new edge-triggered flip-flops are then further resynthesized by the timing resynthesis techniques described in connection with FIGS. 6–11. Therefore, after this further processing, both positive and negative edge-triggered flip-flops will be flip-flops clocked by the internal clock VClk. The resynthesized flip-flops will have an enable signal that is generated by a finite state machine in response to the particular environmental clock signal that gated the original latch element.

Figure 13:
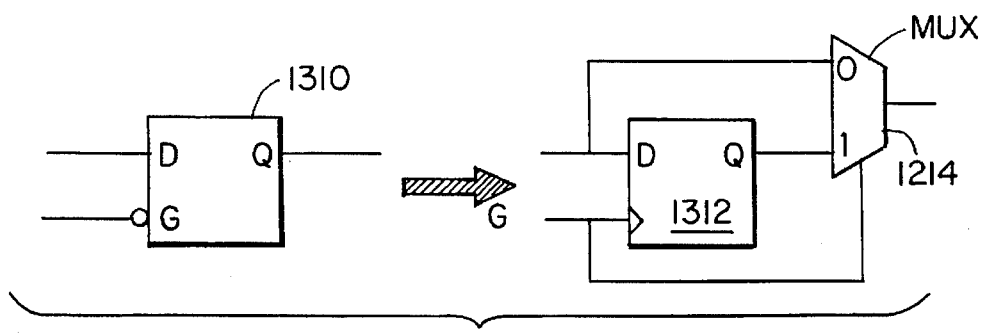
FIG. 13 illustrates a timing resynthesis circuit transformation in which a gated latch is converted into an edge-triggered flip-flop and a multiplexor.

Referring to FIG. 13, in the condition in which the output of a given latch 1310 is sampled both when the latch might be open and might be closed, that latch can be converted to a flip-flop 1312, plus a multiplexor 1314 as shown in FIG. 13. There, when the gate signal G is low, the multiplexor 1314 selects the input signal to the input terminal D of the flip-flop 1312. On the rising edge of the gating signal, however, the input to the D terminal is latched at the output terminal Q. Also, at this point, the gating signal selects the second input to the multiplexor 1214. As with the case in FIG. 12, the result of the transformation in FIG. 13 is subjected to further resynthesis.

The transform of FIG. 13 may exhibit timing problems if the multiplexor is implemented in a technology that exhibits hazards, or output glitches. Output glitches can and could result in set up and hold time problems of the sampling state element. This transformation can therefore only be used when the output is never sampled at discrete times at which the clock may exhibit an edge. If the output is sampled both when the latch might be opened and closed and some sampling occurs on the edge of the gate signal, a final transformation is employed. A new clock signal is created which is phase-locked to the original clock signal and precedes it.

Figure 14A:
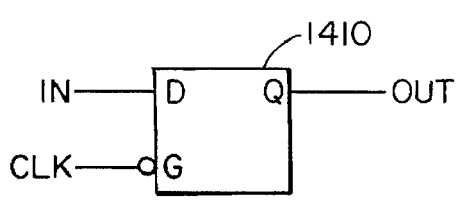
FIGS. 14A and 14B illustrate a timing resynthesis circuit transformation in which a latch is converted to an edge-triggered flip-flop with a negative delay at the clock input terminal to avoid glitches.
Figure 14B:
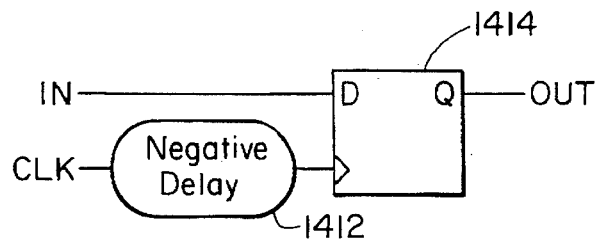

As shown in FIGS. 14A and 14B, the latch 1410 of FIG. 14A is replaced by a flip-flop which receives the phase-advanced clock indicated by the negative delay 1412 as shown in FIG. 14B. The state transition of the new flip-flop 1414 precedes a state transition of any circuits sampling the original output Q of the original latch 1410. If the latch is also sampled when it is open by signals occurring prior to the sampling edge, one of the prior techniques can be employed, either latch to wire or latch to flip-flop and multiplexor transforms of FIG. 13.

As shown in FIG. 14B, the negative delay 1412 represents a time-advanced copy of the clock CLK which is used to clock the flip-flop 1414. While negative-delays are unphysical, this structure can be processed by the timing resynthesis process with a distinct control signal generated by a finite state machine.

Figure 15:
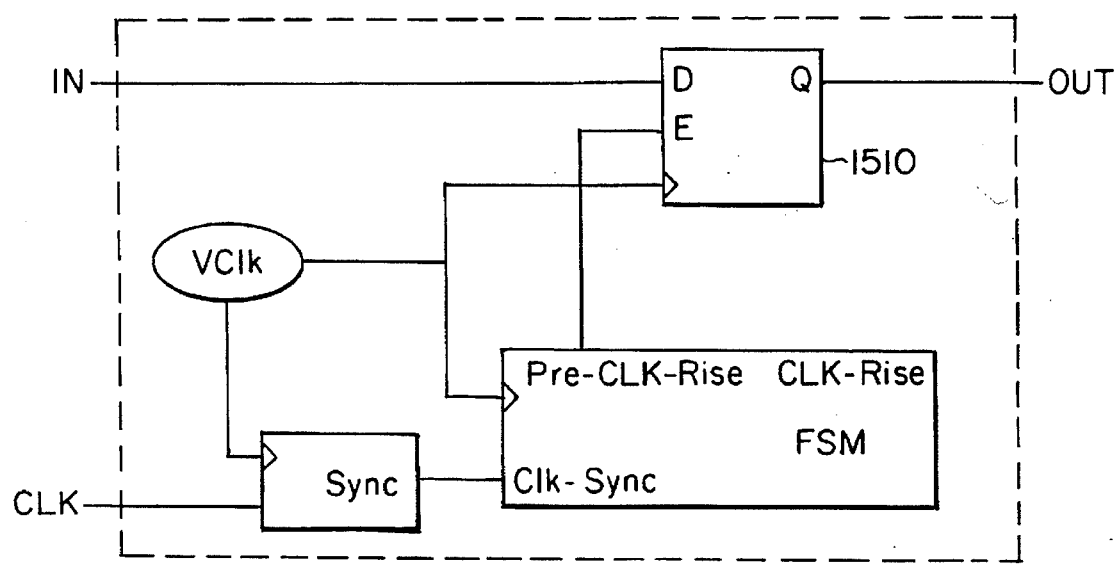
FIG. 15 illustrates a timing resynthesis circuit transformation of the negative delay flip-flop of FIG. 14B into a flip-flop that operates synchronously with the internal clock signal.

FIG. 15 shows a finite state machine FSM generating a pre-CLK-rise control signal one or more cycles of the internal clock VClk prior to the generation of the control signal, CLK-Rise. The control signal CLK-rise is generated in response to the rising edge of the environmental timing signal EClk. As a result, the input signal appearing at the D terminal of the flip-flop 1510 is transferred to the output terminal prior to the rising edge of the environmental clock signal EClk as signaled by the Clk-rise control signal. Subsequent elements can be then load enabled from the CLK-Rise signal generated by the finite state machine FSM. Here again, if the latch of the original digital circuit is sampled both when the latch is opened and closed, a multiplexor can be placed at the output Q of the flip-flop 1510.

Combinational Loop Transformations

Figure 16A:
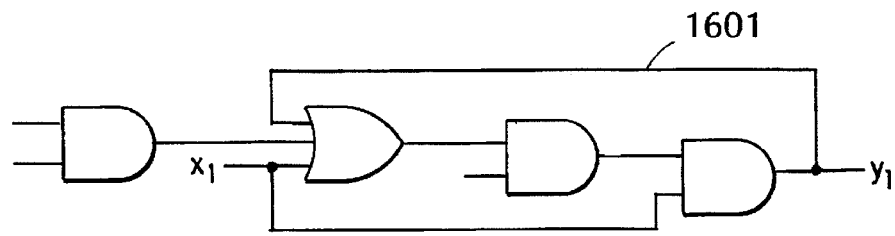
FIGS. 16A and 16B illustrate a timing resythesis circuit transformation in which a flip-flop is inserted in a combinational loop to render the circuit synchronous with the virtual clock.

Combinational loops with an even number of logic inversions around the loop are an implicit state element. An example is shown in FIG. 16A, this implicit state can be transformed into an explicit state element which is clocked by the virtual clock VClk by simply choosing a wire 1601 in the loop and inserting a flip-flop 1602 which is clocked by the virtual clock VClk as shown in FIG. 16B.

The addition of the flip-flop 2602 changes the timing characteristics of the loop. Additional virtual clock cycles are required for the values in the loop to settle into their final states.

Figure 16B:
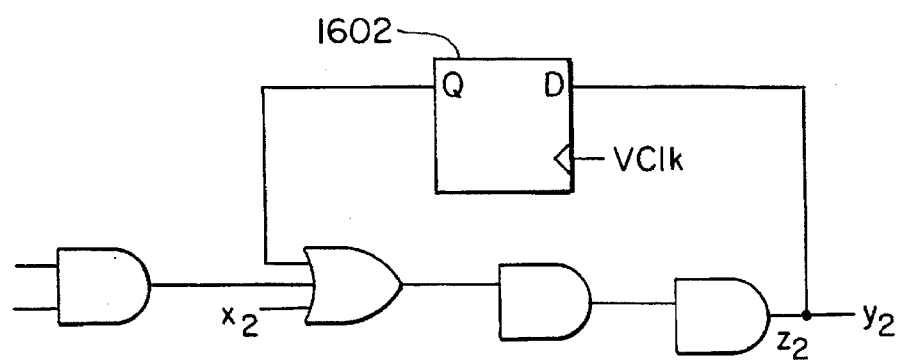

Assume in FIG. 16B that all input values to the loop are ready by some virtual cycle V. In the absence of the flip-flop 1602, all outputs will become correct and stable after some delay period. With the flip-flop 1602, it is necessary to wait until the loop stabilizes and then wait for an additional virtual clock period during which the flip-flop value may change and subsequently change the loop outputs. Thus the outputs of the loop cannot be sampled until virtual cycle V+1.

If combinational cycles are nested, each can be broken by the insertion of a flip-flop as above. Nested loops may require up to $2^N$ clock cycles to settle, where N is the depth of the loop nesting and thus the number of flip-flops needed to break all loops.

RS Latch Transformations

Figure 17A:
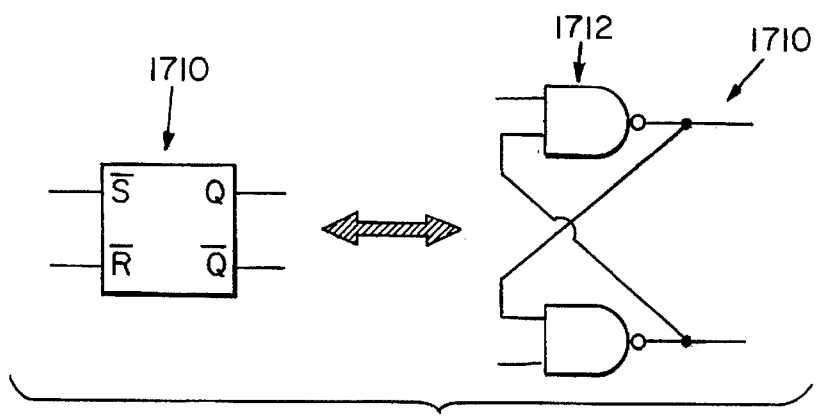
FIGS. 17A and 17B illustrate a timing resynthesis circuit transformation in which an RS flip-flop is transformed into a device that is synchronous with the virtual clock.

RS latches 1710 are asynchronous state elements built from cross-coupled NOR or NAND gates 1712, as illustrated in FIG. 17A.

RS latches 1710 can be transformed based on the transformation for combinational cycles illustrated in FIGS. 16A and 16B. An alternative approach illustrated in FIG. 17B eliminates the combinational cycles associated with RS latches while also avoiding the extended settling time associated with the general combinational cycle transformation of FIG. 16B.

Figure 17B:
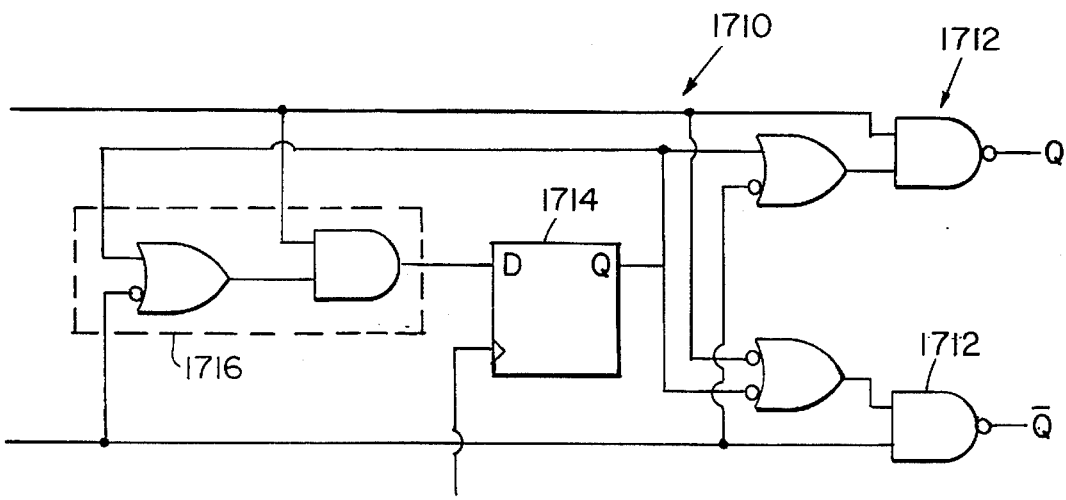

The circuit is FIG. 17B forces the outputs Q and $\overline{Q}$ of the RS latch 1710 combinatorially to their values for all input patterns except the one in which the latch maintains its state. For this pattern, the added flip-flop 1714 produces appropriate values on the outputs. Logic 1716 is provided to set the flip-flop 1714 into an appropriate state, based on the values of the inputs whenever an input pattern dictates a state change. When the latch 1710 is maintaining its state, the outputs will be stable so no propagation is required. Thus the outputs of the transformation are available with only a combinatorial delay.

A symmetrical transformation can be applied to latches produced from cross-coupled NOR gates.

Asynchronous Presets and Clears

Figure 18A:
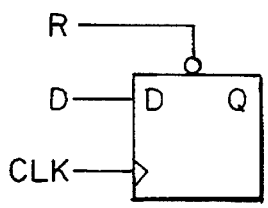
FIG. 18A, 18B, and 18C illustrate a timing resynthesis circuit transformation for handling asynchronous preset and clears of state elements.

Asynchronous presets and clears of state elements shown in FIG. 18A can be transformed in one of two ways. Each transformation relies on the fact that preset and clear signals R are always synchronized to the virtual clock, either because they are internally generated by circuitry which is transformed to be synchronous to the virtual clock or because they are external asynchronous signals which are explicitly synchronized using synchronizer circuitry.

Figure 18B:
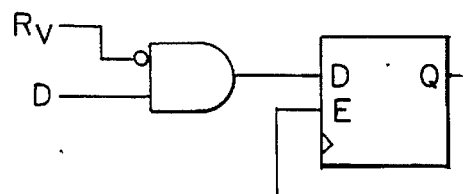
Figure 18B:
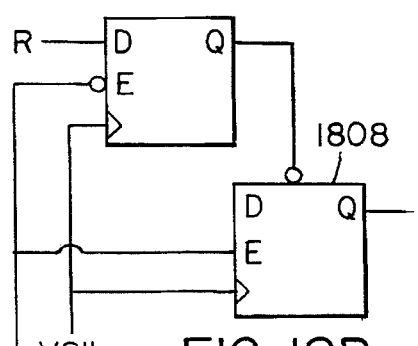

The first transformation, shown in FIG. 18B, makes use of an asynchronous preset or clear on flip-flop 1808 in the FPGA, if such exists. The enable signal E which enables the resynthesized state element to undergo state changes is used to suppress/defer transitions on the preset or clear input R to eliminate race conditions arising from simultaneously clocking and clearing or presenting a state element.

Figure 18C:
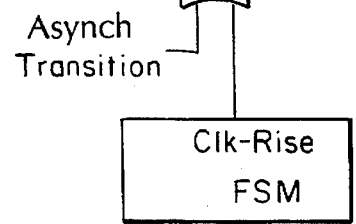

The second transformation shown in FIG. 18C converts an asynchronous preset or clear $R_V$ which has already been synchronized to the clock into a synchronous preset or clear. The enable signal E to the resynthesized state element must be modified to be enabled at any time at which a preset or clear transition might occur by gate 1810.

Returning to FIG. 6, the above described transformations of the timing resynthesis step 618 in combination of with the specification step 610, transition analysis 612, value analysis 614 and sampling analysis 616 enable conversion of a digital circuit description having some arbitrary clocking methodology to a single clock synchronous circuit. The result is a circuit which the state elements are edge-triggered flip-flops.

To generate the logic system 200 having the internal architecture shown in FIG. 4, this resynthesized circuit must now be compiled for and loaded into the configurable logic devices 410–416 by the host workstation 222.

Figure 19:
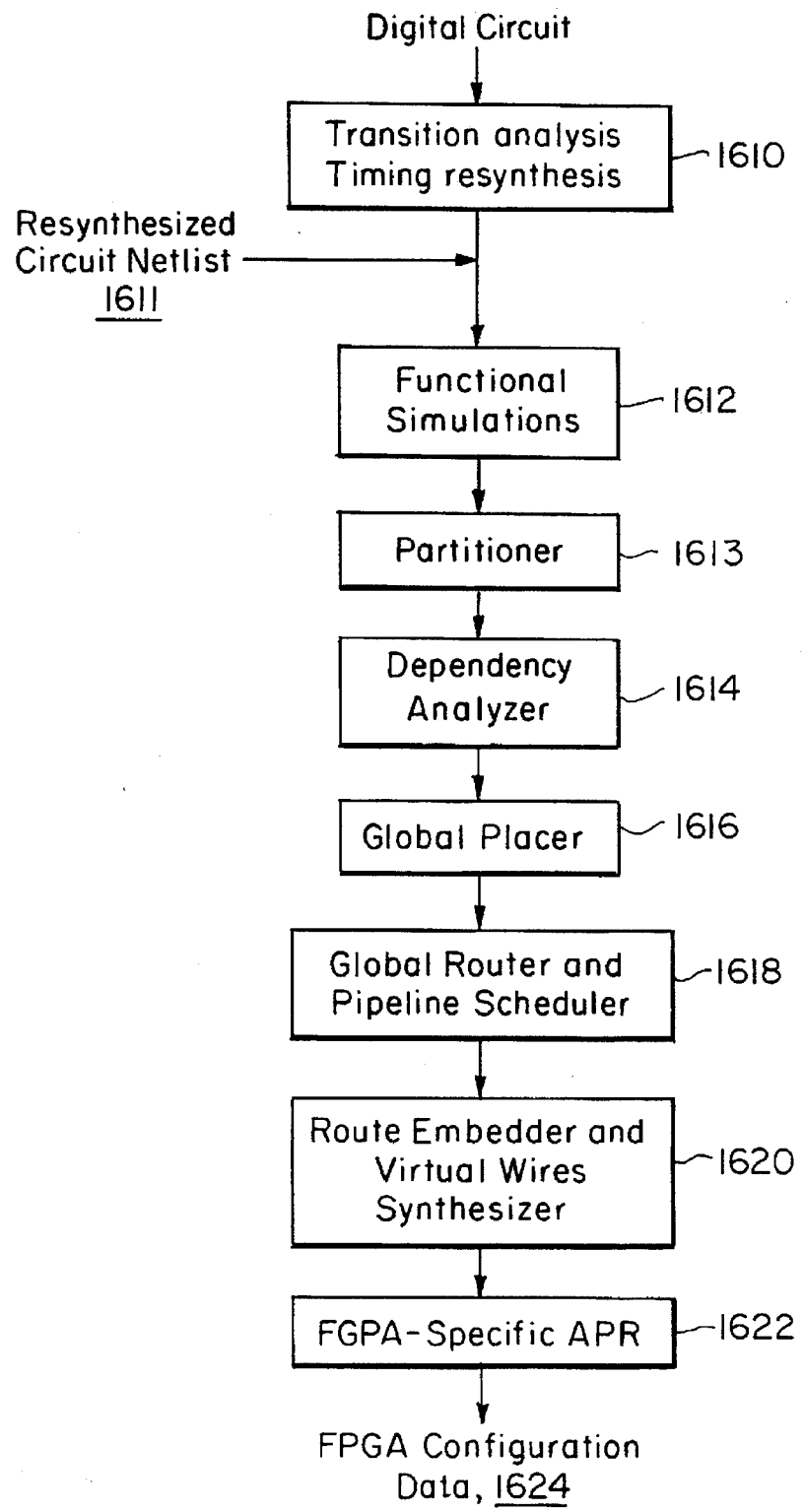
FIG. 19 illustrates the steps performed by a compiler that resynthesizes the digital circuit design and converts it into FPGA configuration data that is loaded into the logic system 200.

FIG. 19 shows the complete compilation process performed by the host workstation 222 to translate the digital circuit description into the configuration data received by the configurable devices 214. More specifically, the input to a compiler running on the host workstation 222 is the digital circuit description in step 1610. This description is used to generate the resynthesized circuit as described above. The result is a logic netlist of the resynthesized circuit 1611. This includes the new circuit elements and the new VClk.

In step 1612, functional simulations of the transformed circuit can be performed. This step ensures that the resynthesized circuit netlist is the functional equivalent of the original digital circuit. It should be noted that the transformed circuit is also more amenable to computer-based simulations. All relevant timing information specifying the behavior of the timing signals including the timing relationship to each other is built into the resynthesized circuit yet the resynthesized circuit is synchronous with a single clock. Therefore, the resynthesized circuit could alternatively be used as the circuit specification for a computer simulation rather than the hardware based simulation on the configurable logic system. The resynthesized circuit is then partitioned 1613 into the logic partition blocks that can fit into the individual FPGAs of the array, see FIG. 2.

In the preferred embodiment of the present invention, techniques described in U.S. patent application Ser. No. 08/042,151, filed on Apr. 2, 1993, entitled Virtual Wires for Reconfigurable Logic System, which is incorporated herein by this reference, are implemented to better utilize pin resources by multiplexing global link transmission on the pins of the FPGAs across the interconnect. Additionally, as described in incorporated U.S. patent application Ser. No. 08/344,723, filed on Nov. 23, 1994, entitled Pipe-Lined Static Router and Scheduler for Configurable Logic System Performing Simultaneous Communication and Computation, signal routing is scheduled so that logic computation and global link transmission through the interconnect happen simultaneously.

Specifically, because a combinatorial signal may pass through several FPGA partitions as global links during an emulated clock cycle, all signals will not be ready to schedule at the same time. This is best solved by performing a dependency analysis, step 1614 on global links that leave a logic partition block. To determine dependencies, the partition circuit is analyzed by backtracing from partition outputs, either output global links or output signals to the target system, to determine on which partition inputs, either input links or input signals from the target system, the outputs depend. In backtracing, it is assumed that all outputs depend on all inputs for gate library parts, and no outputs depend on any inputs for latch or register library parts. If there are no combinatorial loops that cross partition boundaries, this analysis produces a directed acyclic graph, used by a global router. If there are combinatorial loops, then the loops can be hardwired or implemented in a single FPGA. Loops can also be broken by inserting a flip-flop into the loop and allowing enough virtual cycles for signal values to settle to a stable state in the flip-flop.

Individual FPGA partitions must be placed into specific FPGAs (step 1616). An ideal placement minimizes system communication, requiring fewer virtual wire cycles to transfer information. A preferred embodiment first makes a random placement followed by cost-reduction swaps and then optimizes with simulated annealing. During global routing (step 1618), each global link is scheduled to be transferred across the interconnect during a particular period of the pipe-line clock. This step is discussed more completely in the incorporated U.S. patent application Ser. No. 08/344,723, Pipe-Lined Static Router and Scheduler for Configurable Logic System Performing Simultaneous Communication and Computation.

Once global routing is completed, appropriately-sized multiplexors or shift loops, pipeline registers, and associated logic such as the finite state machines that control both the design circuit elements and the multiplexors and pipeline registers are added to each partition to complete the internal configuration of each FPGA chip 22 (steps 1620). See specifically, incorporated U.S. patent application Ser. No. 08/042,151, Virtual Wires for Reconfigurable Logic System. At this point, there is one netlist for each configurable logic device 214 or FPGA chip. These FPGA netlists are then processed in the vender-specific FPGA place-and-route software (step 1622) to produce configuration bit streams (step 1624). Technically, there is no additional hardware support for the multiplexing logic which time-multiplex the global links through the interconnect: the array of configurable logic is itself configured to provide the support. The necessary "hardware" is compiled directly into the configuration of the FPGA chip 214. Some hardware support in the form of special logic for synchronizers to synchronize the external clocks to the internal VClk is recommended.

While this invention has been particularly shown and describe with references to preferred embodiments thereof, it will be understood by those skilled in the art that various changes in form and details may be made therein without departing from the spirit and scope of the invention as defined by the appended claims. For example, it is not a strict necessity that the internal clock signal VClk be distributed directly to the sequential logic elements. Preferably it reaches each element at substantially the same time. In some larger networks, therefore, some delay may be preferable to delay tune the circuit for propagation delays.

We claim:

1. A method of configuring a configurable logic system to operate in an environment, the logic system generating output signals to the environment in response to at least one environmental timing signal and environmental data signals provided from the environment, the method comprising:

defining an internal clock signal;

configuring the logic system to perform logic operations for generating the output signals in response to the environmental data signals and the internal clock signal; and configuring the logic system to have a controller for coordinating operation of the logic operations in response to the internal clock signal and the environmental timing signal.

2. A method of configuring as described in claim 1, further comprising configuring the controller to comprise a synchronizer for sampling the environmental timing signal in response to the internal clock signal.

3. A method of configuring as described in claim 2, further comprising configuring the controller to further comprise a finite state machine for generating control signals to control the logic operations in response to the sampled environmental timing signal.

4. A method of configuring as described in claim 1, further comprising configuring the logic system to have combinational logic and sequential logic to perform the logic operations.

5. A method of configuring as described in claim 4, further comprising configuring the controller to comprise a finite state machine for generating control signals to the sequential logic in response to the environmental timing signal and the internal clock signal.

6. A method of configuring as described in claim 5, further comprising configuring the sequential logic to comprise flip-flops receiving the internal clock signal at a clock input and the control signals at a latch enable input.

7. A method of configuring as described in claim 1, wherein the logic system comprises at least one field programmable gate array.

8. A method of configuring as described in claim 1, wherein the logic system comprises a plurality of configurable logic devices electrically connected via an interconnect for transmitting signals between the chips.

9. A method of configuring as described in claim 8, wherein the interconnect comprises cross bar chips.

10. A method as configuring as described in claim 8, wherein the interconnect utilizes a direct-connect topology.

11. A method of configuring as described in claim 10, wherein the interconnect includes buses.

12. A method of configuring as described in claim 1, further comprising configuring the controller to dictate set-up and hold times of signals to the environment.

13. A method of configuring as described in claim 1, further comprising configuring the controller to dictate sampling times of the environmental data signals.

14. A method for converting a digital circuit design into a new circuit that is substantially functionally equivalent to the digital circuit design, the digital circuit design and the new circuit being adapted to operate in an environment in response to at least one environmental timing signal and environmental data signals and providing output data signals to the environment, the method comprising:

defining an internal clock signal; and resynthesizing sequential logic elements in the digital circuit design that are clocked by the environmental timing signal to sequential logic elements in the new circuit that are clocked by the internal clock signal.

15. A method as claimed in claim 14, wherein the resynthesized sequential logic elements of the new circuit are load enabled in response to the environmental timing signal.

16. A method as claimed in claim 14, wherein the internal clock signal has a substantially higher frequency than the environmental timing signal.

17. A method as claimed in claim 14, wherein a frequency of the internal clock signal is at least four times higher than a frequency of the environmental timing signal.

18. A method as claimed in claim 14, further comprising resynthesizing flip-flops in the digital circuit design that are clocked by the environmental timing signal to flip-flops in the new circuit that are clocked by the internal clock signal.

19. A method as claimed in claim 14, further comprising resynthesizing flip-flops in the digital circuit design that are clocked by the environmental timing signal to flip-flops in the new circuit that are clocked by the internal clock signal and load enabled in response to the environmental timing signal.

20. A method as claimed in claim 14, further comprising resynthesizing flip-flops in the digital circuit design that are clocked by the environmental timing signal to flip-flops in the new circuit that are clocked by the internal clock signal and load enabled by control signals generated by finite state machines operating in response to the environmental timing signal.

21. A method as claimed in claim 14, further comprising resynthesizing latches in the digital circuit design that are gated by the environmental timing signal to flip-flops in the new circuit that are clocked by the internal clock signal.

22. A method as claimed in claim 14, further comprising resynthesizing latches in the digital circuit design that are gated by the environmental timing signal to flip-flops in the new circuit that are clocked by the internal clock signal and load enabled in response to the environmental timing signal.

23. A method as claimed in claim 14, further comprising resynthesizing latches in the digital circuit design that are gated by the environmental timing signal to flip-flops in the new circuit that are clocked by the internal clock signal and load enabled by control signals generated by finite state machines operating in response to the environmental timing signal.

24. A method as claimed in claim 14, further comprising performing a simulation of the new circuit.

25. A method as claimed in claim 14, further comprising resynthesizing latches in the digital circuit design that are gated by the environmental timing signal to cascade-connected flip-flops and multiplexers, the multiplexers receiving select signals derived from the environmental timing signal.

26. A method as claimed in claim 25, wherein the select signals received by the multiplexers are generated by a finite state machine controller.

27. A logic system for generating output signals to an environment in response to at least one environmental timing signal and environmental data signals provided from the environment, the logic system comprising:

an internal clock for generating an internal clock signal for the logic system;

logic means for generating the output signals in response to the environmental data signals; and controller means for coordinating operation of the logic means in response to the internal clock signal and the environmental timing signal.

28. A logic system for generating output signals to an environment in response to at least one environmental timing signal and environmental data signals provided from the environment, the logic system comprising:

an internal clock for generating an internal clock signal for the logic system;

at least one configurable logic device including:

logic which generates the output signals in response to the environmental data signals and the internal clock signal; and a controller which coordinates operation of the logic in response to the internal clock signal and the environmental timing signal.

29. A logic system as described in claim 28, wherein the controller comprises a synchronizer for sampling the environmental timing signal in response to the internal clock signal.

30. A logic system as described in claim 29, wherein the synchronizer is constructed from non-programmable logic.

31. A logic system as described in claim 29, wherein the controller further comprises a finite state machine for generating control signals to the combinational logic in response to the sampled environmental timing signal.

32. A logic system as described in claim 28, wherein the logic comprises combinational logic and sequential logic.

33. A logic system as described in claim 32, wherein the controller comprises a finite state machine for generating control signals to the sequential logic in response to the environmental timing signal and the internal clock signal.

34. A logic system as described in claim 33, wherein the sequential logic comprises flip-flops receiving the internal clock signal at a clock input and the control signals at a latch enable input.

35. A logic system as described in claim 28, wherein the at least one configurable logic device comprises at least one field programmable gate array.

36. A logic system as described in claim 28, further comprising an interconnect for transmitting signals between plural configurable logic devices.

37. A configurable logic system, comprising:

at least one configurable logic device;

an interconnect providing connections between the logic device and an environment to convey output data signals from the configurable logic device and at least one environmental timing signal and environmental data signals from the environment; and a configurer for programming the configurable logic device to synchronize the environmental timing signal to an internal clock signal of the logic system.

38. A configurable logic system as described in claim 37, wherein the configurer converts a digital circuit design into a new circuit that is substantially functionally equivalent to the digital circuit design, and programs the at least one configurable logic device with the new circuit.

39. A configurable logic system as described in claim 38, wherein the configurer converts the digital circuit design into the new circuit by resynthesizing sequential logic elements in the digital circuit design that operate in response to the environmental timing signal to operate in response to the internal clock signal in the new circuit.

40. A configurable logic system as described in claim 37, wherein the configurer programs the configurable logic device to have logic and a controller for coordinating operation of the logic in response to the internal clock signal and the environmental timing signal.

41. A configurable logic system as described in claim 40, wherein the configurer programs the controller to include a synchronizer for sampling the environmental timing signal in response to the internal clock signal.

42. A configurable logic system as described in claim 41, wherein the configurer programs the controller to include a finite state machine for generating control signals to the logic in response to the sampled environmental timing signal.

43. A configurable logic system as described in claim 41, wherein the configurer programs the logic to include combinational logic and sequential logic.

44. A configurable logic system as described in claim 41, wherein the configurer programs the controller to include a finite state machine for generating control signals to the sequential logic in response to the environmental timing signal and the internal clock signal.

45. A configurable logic system as described in claim 37, wherein the configurer programs the configurable logic device to include flip-flops that are clocked by the internal clock signal and load enabled in response to the environmental timing signal.

46. A configurable logic system as described in claim 37, wherein the configurer programs the configurable logic device to include:

flip-flops that are clocked by the clock signal and load enabled by control signals; and finite state machines generating the control signals in response to the environmental timing signal.

47. A configurable logic system as described in claim 37, wherein the environment is a cycle simulation.

48. A configurable logic system as described in claim 37, wherein the environment is a hardware system.

49. A configurable logic system as described in claim 48, wherein the configurable logic system is a logic emulator.

50. A configurable logic system as described in claim 37, wherein the logic system is a simulation accelerator.

* * * * *